US008824142B2

(12) United States Patent
Jewell-Larsen et al.

(10) Patent No.: US 8,824,142 B2
(45) Date of Patent: Sep. 2, 2014

(54) ELECTROHYDRODYNAMIC FLUID MOVER TECHNIQUES FOR THIN, LOW-PROFILE OR HIGH-ASPECT-RATIO ELECTRONIC DEVICES

(75) Inventors: Nels Jewell-Larsen, San Jose, CA (US); Kenneth A. Honer, Santa Clara, CA (US); Ron Goldman, Oakland, CA (US); Matthew K. Schwiebert, Cupertino, CA (US)

(73) Assignee: Panasonic Precision Devices Co., Ltd., Kumamoto (JP)

( * ) Notice: Subject to any disclaimer, the term of this patent is extended or adjusted under 35 U.S.C. 154(b) by 749 days.

(21) Appl. No.: 13/105,343

(22) Filed: May 11, 2011

(65) Prior Publication Data

US 2011/0292560 A1    Dec. 1, 2011

Related U.S. Application Data

(60) Provisional application No. 61/348,716, filed on May 26, 2010, provisional application No. 61/478,312, filed on Apr. 22, 2011.

(51) Int. Cl.
*H01T 23/00*    (2006.01)
*H05K 7/20*    (2006.01)

(52) U.S. Cl.
USPC ............... 361/694; 361/679.46; 361/679.48; 361/679.55; 361/689; 361/690; 361/695; 165/104.33; 165/121; 165/124; 165/185; 454/184; 417/49; 313/582

(58) Field of Classification Search
USPC ............. 361/679.46–679.55, 688–695, 230, 361/231, 704–714, 816, 818, 78; 165/121–127, 104.33, 104.34, 185; 313/11, 13, 22–25, 35, 36, 44–47, 582; 349/20, 58, 60–65, 161; 345/84, 87; 454/184

See application file for complete search history.

(56) References Cited

U.S. PATENT DOCUMENTS

| 6,443,704 | B1 | 9/2002 | Darabi et al. |
| 6,504,308 | B1 | 1/2003 | Krichtafovitch et al. |
| 6,522,536 | B2 * | 2/2003 | Brewer et al. ............ 361/679.47 |
| 6,919,698 | B2 | 7/2005 | Krichtafovitch |

(Continued)

FOREIGN PATENT DOCUMENTS

WO    2007112763 A1    10/2007

OTHER PUBLICATIONS

Schlitz, Dan and Singhal, Vishal, "An Electro-Aerodynamic Solid-State Fan and Cooling System," 24th Annual IEEE Semiconductor Thermal Measurement and Management Symposium, May 2, 2008, pp. 46-49.

(Continued)

*Primary Examiner* — Michail V Datskovskiy
(74) *Attorney, Agent, or Firm* — Panasonic Patent Center

(57) ABSTRACT

Surfaces for electromagnetic shielding, retaining electrostatic charge and indeed collecting ion current in EHD fluid mover designs may be formed as or on surfaces of other components and/or structures in an electronic device. In this way, dimensions may be reduced and packing densities increased. In some cases, electrostatically operative portions of an EHD fluid mover are formed as or on surfaces of an enclosure, an EMI shield, a circuit board and/or a heat pipe or spreader. Depending on the role of these electrostatically operative portions, dielectric, resistive and/or ozone robust or catalytic coatings or conditioning may be applied.

54 Claims, 13 Drawing Sheets

(56) References Cited

U.S. PATENT DOCUMENTS

| | | | |
|---|---|---|---|
| 7,157,704 B2 | 1/2007 | Krichtafovitch et al. | |
| 7,159,646 B2 | 1/2007 | Dessiatoun et al. | |
| 7,190,587 B2 * | 3/2007 | Kim et al. | 361/704 |
| 7,214,949 B2 | 5/2007 | Schlitz | |
| 7,242,568 B2 * | 7/2007 | Jang et al. | 361/230 |
| 7,269,008 B2 * | 9/2007 | Mongia et al. | 361/689 |
| 7,334,630 B2 | 2/2008 | Goodson et al. | |
| 7,545,640 B2 | 6/2009 | Fisher et al. | |
| 7,661,468 B2 | 2/2010 | Schlitz | |
| 8,054,626 B2 * | 11/2011 | Lee et al. | 361/694 |
| 8,139,354 B2 * | 3/2012 | June et al. | 361/679.47 |
| 8,305,728 B2 * | 11/2012 | Lee et al. | 361/231 |
| 2002/0122728 A1 * | 9/2002 | Darabi et al. | 417/48 |
| 2005/0047056 A1 * | 3/2005 | Huang | 361/212 |
| 2006/0005946 A1 | 1/2006 | Borgstrom et al. | |
| 2006/0054227 A1 | 3/2006 | Sohn | |
| 2006/0060333 A1 | 3/2006 | Chordia et al. | |
| 2006/0061967 A1 | 3/2006 | Kim et al. | |
| 2007/0020124 A1 * | 1/2007 | Singhal et al. | 417/413.2 |
| 2009/0261268 A1 | 10/2009 | Schwiebert et al. | |
| 2010/0177519 A1 * | 7/2010 | Schlitz | 362/294 |
| 2010/0277844 A1 * | 11/2010 | Lueck | 361/78 |
| 2011/0139401 A1 * | 6/2011 | Huang et al. | 165/96 |

OTHER PUBLICATIONS

Kercher Dan S., et al., "Microjet Cooling Devices for Thermal Management of Electronics," IEEE Transactions on Components and Packaging Technologies, Jun. 2003, vol. 26, No. 2, pp. 359-366.

Mirza, Kazim, "Feasibility Study of Application of Electrohydrodynamics to Actuation and Cooling Systems," Dissertation, School of Engineering, University of Dayton, Dec. 2008, 122 pages.

Jewel-Larsen, Nels E., et al., "Modeling of corona-induced electrohydrodynamic flow with COMSOL multiphysics," Proceedings of ESA Annual Meeting on Electrostatics 2008, 13 pages.

* cited by examiner

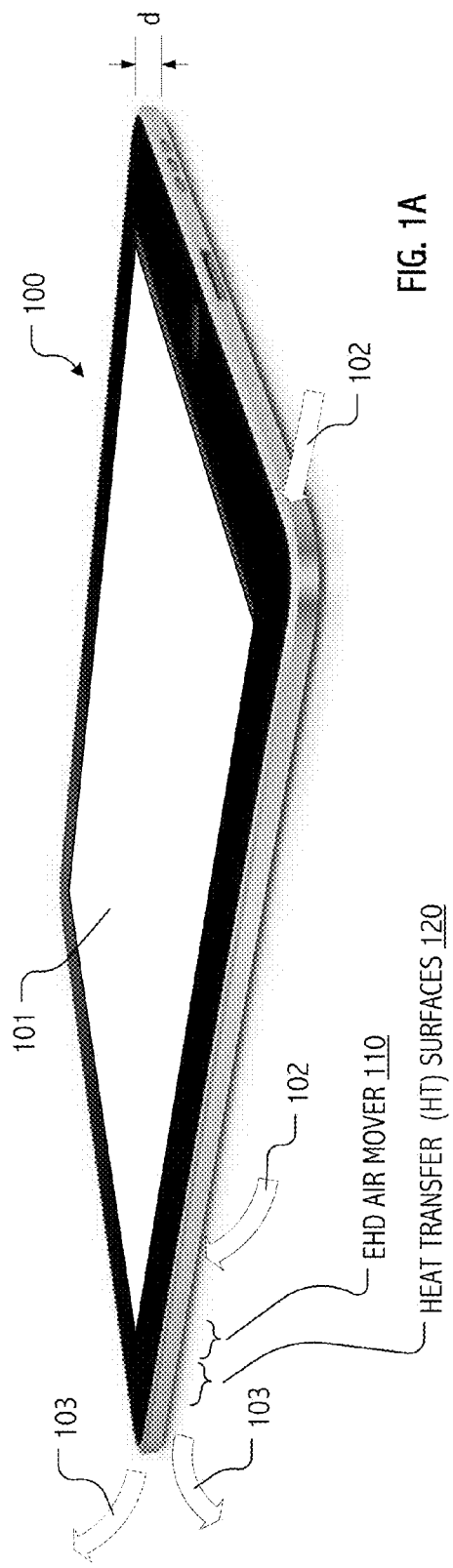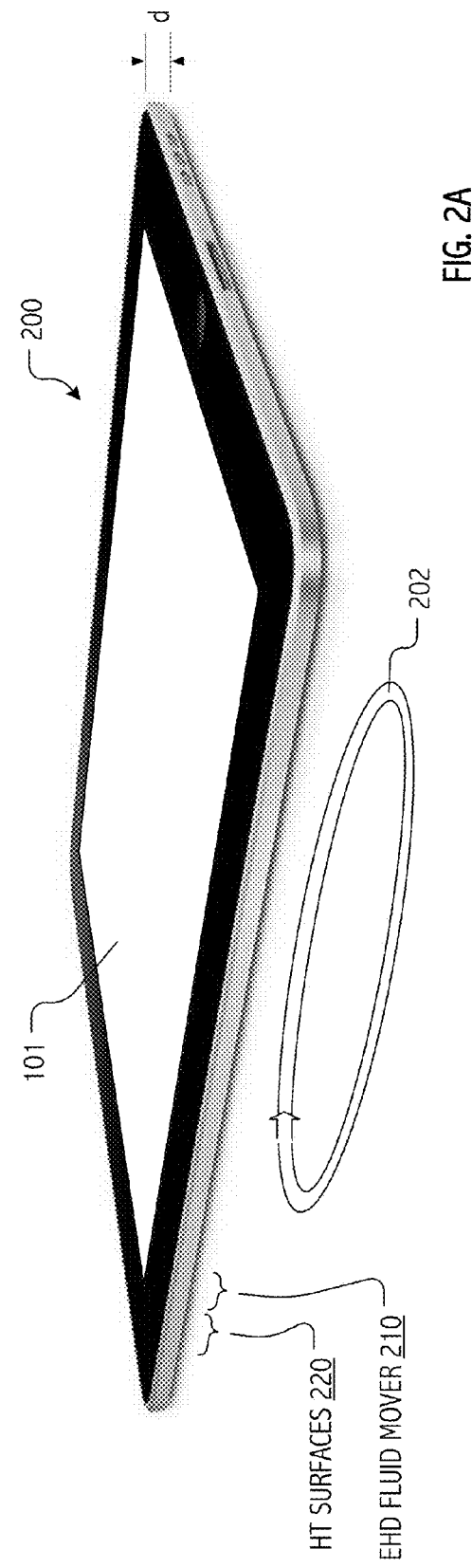

ELECTROHYDRODYNAMIC FLUID MOVER TECHNIQUES FOR THIN, LOW-PROFILE OR HIGH-ASPECT-RATIO ELECTRONIC DEVICES

CROSS-REFERENCE TO RELATED APPLICATION(S)

The present application claims the benefit of U.S. Provisional Application Nos. 61/348,716, filed May 26, 2010, and 61/478,312, filed Apr. 22, 2011, each of which is incorporated herein in its entirety by reference.

BACKGROUND

1. Field

The present application relates to thermal management and, more particularly, to micro-scale cooling devices that generate ions and electrical fields to motivate flow of fluids, such as air, as part of a thermal management solution to dissipate heat.

2. Related Art

Devices built to exploit ionic movement of a fluid are variously referred to in the literature as ionic wind machines, electric wind machines, corona wind pumps, electro-fluid-dynamic (EFD) devices, electrohydrodynamic (EHD) thrusters, EHD gas pumps and EHD fluid or air movers. Some aspects of the technology have also been exploited in devices referred to as electrostatic air cleaners or electrostatic precipitators.

When employed as part of a thermal management solution, an ion flow fluid mover may result in improved cooling efficiency with reduced vibrations, power consumption, electronic device temperatures and/or noise generation. These attributes may reduce overall lifetime costs, device size or volume, and in some cases may improve system performance or user experience.

As electronic device designers drive to smaller and smaller form-factors, such as in the extremely thin handheld devices popularized by iPhone™ and iPad™ devices available from Apple, Inc., packing densities of components and subsystems create significant thermal management challenges. In some cases, active strategies to exhaust heat to the ambient environment may be required. In some cases, mass transport across a ventilation boundary may be unnecessary, but heat transport within the device may be necessary or desirable to reduce hotspots.

Ion flow fluid movers present an attractive technology component of thermal management solutions. Solutions are desired that allow ion flow fluid movers to be integrated in thin and/or densely packed electronic devices, often in volumes that provide as little as 2-3 mm of clearance in a critical dimension. In particular, solutions are desired that allow dense packing of high-voltage, ion-flux generating EHD components with electronic assemblies that may be otherwise sensitive to electrostatic discharge and or electromagnetic interference. In some cases, solutions are desired that manage or mitigate ozone byproducts of certain high intensity fields and/or discharges.

SUMMARY

It has been discovered that surfaces for electromagnetic shielding, retaining electrostatic charge and indeed collecting ion current in EHD fluid mover designs may be opportunistically formed as or on surfaces of other components and/or structures in an electronic device. In this way, dimensions may be reduced and packing densities increased. In some cases, electrostatically operative portions of an EHD fluid mover are formed as or on interior surfaces of an enclosure, an EMI shield, a circuit board and/or a heat pipe or spreader. Depending on the role of these electrostatically operative portions, dielectric, resistive and/or ozone robust or catalytic coatings or conditioning may be applied.

In some embodiments in accordance with the present invention(s), an electronic device includes an enclosure; at least one electronic assembly including one or more thermal sources disposed thereon; and an EHD fluid mover configured as part of a thermal management system for the electronic device, wherein at least one electrostatically operative portion of the EHD fluid mover is formed as, or on, an interior surface of the enclosure. In some cases, the electronic device has a thickness of less than about 10 mm and extent in one or more lateral dimensions that exceeds the thickness by at least a factor of 10::1.

In some embodiments, the EHD fluid mover includes at least one emitter electrode and at least one collector electrode, wherein the at least one electrostatically operative portion includes the collector electrode. In some embodiments, the at least one electrostatically operative portion includes a dielectric coated field shaping portion of the interior surface of the enclosure adjacent to the emitter electrode. In some cases, the dielectric is provided at least in part as a polyimide film or tape affixed, at least in part, on or over the interior surface. In some cases, the dielectric is resistant to degradation in an ozone containing fluid. In some cases, the dielectric coated field shaping portion of the interior surface extends about three (3) emitter electrode to collector electrode lengths upstream of the emitter electrode.

In some embodiments, the low profile device further includes a second electrostatically operative portion of the EHD fluid mover overlaying at least a portion of the electronic assembly. In some cases, the overlaid portion of the electronic assembly defines at least a portion of a high voltage power supply coupled to energize the EHD fluid mover. In some cases, the electronic assembly includes one or more of a circuit board and a display device. In some cases, the thermal sources include one or more of a processor; a radio frequency (RF) or optical transceiver; and illumination sources for a display device.

In some embodiments, the enclosure is substantially sealed such that fluid flow motivated by the EHD fluid mover is substantially contained within the enclosure. In some embodiments, the enclosure allows at least some fluid flow to transit a boundary between an interior volume therewithin and the exterior. In some cases, flux of fluid through the EHD fluid mover substantially exceeds, at least by a factor of two, that transiting the boundary. In some cases, the enclosure includes one or more ventilation portions of the boundary through which a substantial entirety of the fluid flux motivated by the EHD fluid mover is admitted and exhausted.

In some embodiments, the thermal sources are closely proximate, within about 3 mm, of an interior surface of the enclosure, and the thermal management system operable to spread heat evolved at the thermal sources over a substantial portion of the interior surface.

In some embodiments, the electronic device is configured as one or more of a handheld mobile phone or personal digital assistant; a laptop, netbook or pad-type computer; and a digital book reader, media player or gaming device. In some embodiments, the electronic device is configured as one or more of a display panel and a television.

In some embodiments in accordance with the present invention, an electronic device includes at least one electronic assembly including one or more thermal sources disposed thereon; an electromagnetic interference (EMI) shield of conductive material; and an EHD fluid mover configured as part of a thermal management system for the electronic device, wherein at least one electrostatically operative portion of the EHD fluid mover is formed as, or on, a surface of the EMI shield.

In some embodiments, the EMI shield at least partially overlays a portion of the electronic assembly. In some cases, the overlaid portion the electronic assembly includes at least a portion of a high voltage power supply coupled to energize the EHD fluid mover. In some cases, one or more conductive planes or traces of the electronic assembly provide the EMI shield.

In some embodiments, the electronic device has a thickness of less than about 10 mm, and extent in one or more lateral dimensions exceeds the thickness by at least a factor of 10::1.

In some embodiments, the EHD fluid mover includes at least one emitter electrode and at least one collector electrode, wherein the at least one electrostatically operative portion includes the collector electrode. In some embodiments, the at least one electrostatically operative portion includes a dielectric coated field shaping portion of the surface of the EMI shield adjacent to the emitter electrode. In some cases, the dielectric coated field shaping portion of the exposed surface extends about three (3) emitter electrode to collector electrode lengths upstream of the emitter electrode. In some cases, the dielectric coating is resistant to degradation in an ozone containing fluid.

In some embodiments, the electronic assembly includes one or more of a circuit board and a display device. In some embodiments, the thermal sources include one or more of a processor; a radio frequency (RF) or optical transceiver; and illumination sources for a display device.

In some embodiments, the electronic device further includes an enclosure substantially sealed such that fluid flow motivated by the EHD fluid mover is substantially contained within the enclosure. In some embodiments, the electronic device further includes an enclosure that allows at least some fluid flow to transit a boundary between an interior volume therewithin and the exterior. In some cases, flux of fluid through the EHD fluid mover substantially exceeds, at least by a factor of two, that transiting the boundary. In some cases, the enclosure includes one or more ventilation portions of the boundary through which a substantial entirety of the fluid flux motivated by the EHD fluid mover is admitted and exhausted.

In some embodiments, the electronic device further includes an enclosure, wherein the thermal sources are closely proximate, within about 3 mm, of an interior surface of the enclosure, the thermal management system being operable to spread heat evolved at the thermal sources over a substantial portion of the interior surface.

In some embodiments, the electronic device further includes an enclosure, wherein at least one other electrostatically operative portion of the EHD fluid mover is formed as, or on, an interior surface of the enclosure.

In some embodiments, the EMI shield also defines at least a portion of a thermally conductive pathway from the thermal sources to heat transfer surfaces in a flow path along which fluid flow is motivated by the EHD fluid mover when energized.

In some embodiments in accordance with the present invention, an electronic device includes a display; at least one circuit board, an electrohydrodynamic (EHD) fluid mover and an enclosure layered one atop another to define a total thickness of the electronic device at less than about 10 mm.

The EHD fluid mover is configured as part of a thermal management system for the electronic device and including opposing planar dielectric surfaces, at least one emitter electrode and one or more collector electrodes, the emitter electrode positioned between the opposing planar dielectric surfaces and proximate to the collector electrode to, when energized, accelerate ions toward the collector electrode and thereby motivate fluid flow within the electronic device, wherein a first one of the opposing dielectric surfaces is at least partially formed as or on a surface of an EMI shield over the circuit board.

In some embodiments, the collector electrodes number at least two and a first one of the collector electrodes formed as or on an exposed metallization layer of the circuit board. In some embodiments, a second one of the collector electrodes is formed as or on an interior surface of the enclosure. In some embodiments, at least a portion of the EMI shield is formed as or on a dielectric coated metallization layer of the circuit board.

In some embodiments, the electronic device of further includes a thermal transfer pathway from one or more thermal sources disposed on the circuit board to heat transfer surfaces in a flow path along which fluid flow is motivated by the EHD fluid mover when energized. In some cases, at least a portion of the thermal transfer pathway provided by the EMI shield.

In some embodiments, the thermal sources are closely proximate, within about 3 mm, of an interior surface of the enclosure, and the thermal management system is operable to spread heat evolved at the thermal sources over a substantial portion of the interior surface.

In some embodiments, the enclosure substantially seals the electronic device such that fluid flow motivated by the EHD fluid mover is substantially contained therewithin. In some embodiments, the enclosure allows at least some fluid flow to transit a boundary between an interior volume therewithin and the exterior. In some embodiments, flux of fluid through the EHD fluid mover substantially exceeds, at least by a factor of two, that transiting the boundary. In some embodiments, the enclosure includes one or more ventilation portions of the boundary through which a substantial entirety of the fluid flux motivated by the EHD fluid mover is admitted and exhausted.

In some embodiments, the electronic device is configured as one or more of a handheld mobile phone or personal digital assistant; a laptop, netbook or pad-type computer; and a digital book reader, media player or gaming device. In some embodiments, the electronic device is configured as one or more of a display panel and a television.

In some embodiments, at least a portion of either or both of the circuit board and an interior surface of the enclosure are coated with a protective coating robust to ozone. In some embodiments, the protective coating robust to ozone includes a fluoropolymer of tetrafluoroethylene such as a Teflon® material. In some embodiments, at least a portion of either or both of the circuit board and an interior surface of the enclosure are coated with an ozone catalytic or reactive material.

In some embodiments in accordance with the present invention, an electronic device includes an electronic assembly having one or more thermal sources disposed thereon; and a thermal management system including an EHD fluid mover and a heat transfer pathway from the thermal sources to heat transfer surfaces in a flow path of fluid motivated by operation of the EHD fluid mover, the heat transfer pathway including surfaces coated with an ozone resistant dielectric.

In some embodiments, the heat transfer pathway includes either or both of a heat pipe and a head spreader. In some embodiments, at least a portion of the heat transfer pathway is coated with an ozone catalytic or reactive material. These and other embodiments will be understood with reference to the description herein, the drawings and the appended claims.

BRIEF DESCRIPTION OF THE DRAWINGS

The present invention may be better understood, and its numerous objects, features, and advantages made apparent to those skilled in the art by referencing the accompanying drawings. Drawings are not necessarily to scale; rather, emphasis has instead been placed upon illustrating the structural and fabrication principles of the described embodiments.

FIG. 1A is a perspective view of an illustrative, pad-type, consumer electronics device in which, in accord with some embodiments of the present invention, an EHD fluid mover is accommodated within a total device thickness of typically less than about 10 mm, including the thickness of a display surface that covers a substantial entirety of a major surface thereof.

FIG. 2A is a perspective view of an illustrative, pad-type, consumer electronics device, again in accord with some embodiments of the present invention, in which an EHD fluid mover is accommodated within a total device thickness of typically less than about 10 mm, including the thickness of a display surface that covers a substantial entirety of a major surface thereof.

FIGS. 5 and 6 depict illustrative cross-sections in which a display surface is part of the device stack that includes an EHD fluid mover. FIG. 6 depicts an illustrative cross-section in which collector electrode surfaces are formed on a metallization of a printed circuit board.

FIG. 7C depicts an interior view with illustrative positioning an EHD air mover, whereas FIG. 7B depicts a top surface view in which the keyboard (and its underlying electronic assembly) at least partially overlays the EHD air mover.

FIG. 8C depicts an alternative cross-section wherein an exoskeletal structure of an EHD air mover subassembly facilitates relative positional fixation of collector and emitter electrodes with respect to each other, and wherein at least a portion of one of the electrostatically operative surfaces is formed over a portion of the exoskeletal structure.

Use of the same reference symbols in different drawings indicates similar or identical items.

DETAILED DESCRIPTION

Figure 1B:
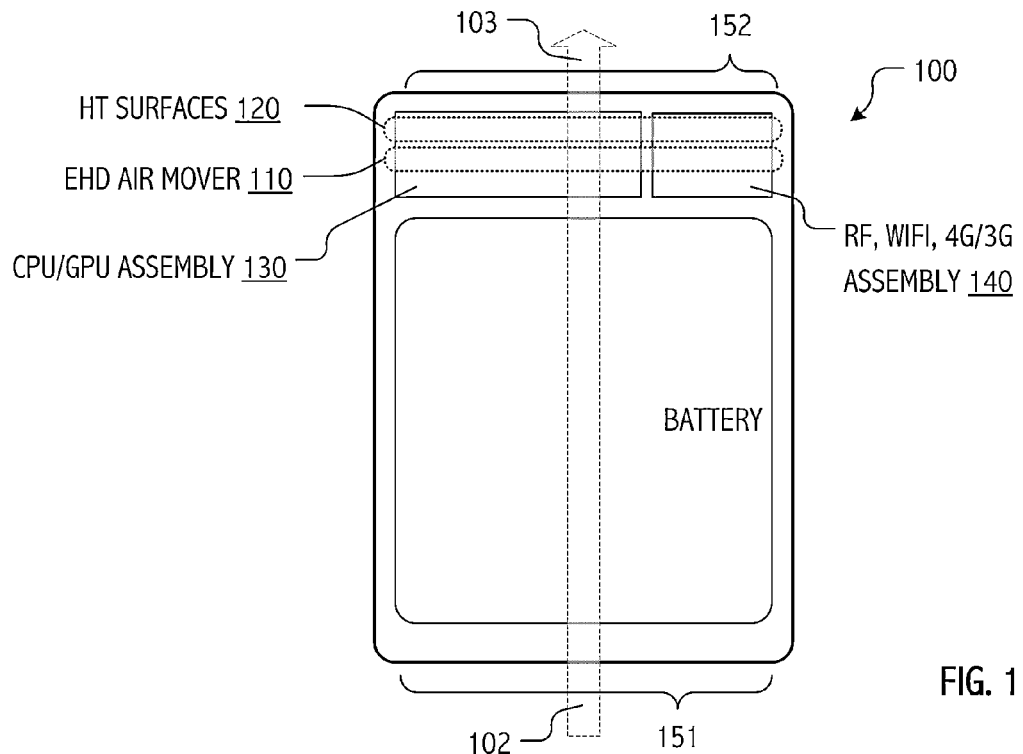
FIG. 1B depicts (in general correspondence with an interior volume of the device of FIG. 1A) an illustrative ventilating air flow topology and placement of an EHD fluid mover relative to respective electronic assemblies.

As will be appreciated, many of the designs and techniques described herein have particular applicability to the thermal management challenges of densely-packed devices and small form-factors typical of modern consumer electronics. Indeed, some of the EHD fluid/air mover designs and techniques described herein facilitate active thermal management in electronics whose thinness or industrial design precludes or limits the viability of mechanical air movers such as fans, blowers, etc. In some embodiments, such EHD fluid/air movers may be fully integrated in an operational system such as a pad-type or laptop computer, a projector or video display device, a set-top box, etc. In other embodiments, such EHD fluid/air movers may take the form of subassemblies or enclosures adapted for use in providing such systems with EHD motivated flows.

In general, a variety of scales, geometries and other design variations are envisioned for electrostatically operative surfaces that provide field shaping or that functionally constitute a collector electrode, together with a variety of positional interrelationships between such electrostatically operative surfaces and the emitter and/or collector electrodes of a given EHD device. For purposes of illustration, we focus on certain exemplary embodiments and certain surface profiles and positional interrelationships with other components. For example, in much of the description herein, opposing planar collector electrodes are formed on interior surfaces of an enclosure or on an exposed surface of an electromagnetic interference (EMI) shield or printed circuit board (PCB) and arranged as parallel surfaces proximate to a corona discharge-type emitter wire that is displaced from leading portions of the respective collector electrodes. Nonetheless, other embodiments may employ other electrostatically operative surface configurations or other ion generation techniques and will nonetheless be understood in the descriptive context provided herein.

In the present application, some aspects of embodiments illustrated and described herein are referred to as electrohydrodynamic fluid accelerator devices, also referred to as "EHD devices," "EHD fluid accelerators," "EHD fluid movers," and the like. For purposes of illustration, some embodiments are described relative to particular EHD device configurations in which a corona discharge at or proximate to an emitter electrode operates to generate ions that are accelerated in the presence of electrical fields, thereby motivating fluid flow. While corona discharge-type devices provide a useful descriptive context, it will be understood (based on the present description) that other ion generation techniques may also be employed. For example, in some embodiments, techniques such as silent discharge, AC discharge, dielectric barrier discharge (DBD), or the like, may be used to generate ions that are in turn accelerated in the presence of electrical fields and motivate fluid flow.

Using heat transfer surfaces that, in some embodiments, take the form of heat transfer fins, heat dissipated by electronics (e.g., microprocessors, graphics units, etc.) and/or other components can be transferred to the EHD motivated fluid flow and exhausted from an enclosure through a ventilation boundary. Typically, when a thermal management system is integrated into an operational environment, heat transfer paths (often implemented as heat pipes or using other technologies) are provided to transfer heat from where it is dissipated (or generated) to a location (or locations) within the enclosure where air flow motivated by an EHD device (or devices) flows over heat transfer surfaces.

For illustration, heat transfer fins are depicted with respect to various exemplary embodiments. However, as will be appreciated based on the description herein, in some embodiments, conventional arrays of heat sink fins need not be provided and EHD motivated fluid flow over exposed interior surfaces, whether proximate a heat generating device (such as a processor, memory, RF section, optoelectronics or illumination source) or removed therefrom, may provide sufficient heat transfer. In each case, provision of ozone catalytic or reactive surfaces/materials on heat transfer surfaces may be desirable. Typically, heat transfer surfaces, field shaping surfaces and dominant ion collecting surfaces of a collector electrode present differing design challenges and, relative to some embodiments, may be provided using different structures or with different surface conditioning. However, in some embodiments, a single structure may be both electrostatically operative (e.g., to shape fields or collect ions) and provide heat transfer into an EHD motivated fluid flow.

Note that, in some unventilated embodiments, EHD motivated fluid flow may be circulated within an enclosure, which in turn, may radiatively or convectively transfer heat to the ambient environment. In this way, hotspots on the exterior surface of the enclosure can be eliminated or at least mitigated even without significant airflow through a ventilation boundary. Of course, in some embodiments, EHD motivated flow(s) may be employed both to manage localized hotspots and to exhaust heat by forced convective heat transfer to an air flow that transits a ventilation boundary.

Electrohydrodynamic (EHD) Fluid Acceleration, Generally

Basic principles of electrohydrodynamic (EHD) fluid flow are well understood in the art and, in this regard, an article by Jewell-Larsen, N. et al., entitled "Modeling of corona-induced electrohydrodynamic flow with COMSOL multiphysics" (in the *Proceedings of the ESA Annual Meeting on Electrostatics* 2008) (hereafter, "the Jewell-Larsen Modeling article"), provides a useful summary. Likewise, U.S. Pat. No. 6,504,308, filed Oct. 14, 1999, naming Krichtafovitch et al. and entitled "Electrostatic Fluid Accelerator" describes certain electrode and high voltage power supply configurations useful in some EHD devices. U.S. Pat. No. 6,504,308, together with sections I (Introduction), II (Background), and III (Numerical Modeling) of the Jewell-Larsen Modeling article are hereby incorporated by reference herein for all that they teach.

EHD fluid mover designs described herein can include one or more corona discharge-type emitter electrodes. In general, such corona discharge electrodes include a portion (or portions) that exhibit(s) a small radius of curvature and may take the form of a wire, rod, edge or point(s). Other shapes for the corona discharge electrode are also possible; for example, the corona discharge electrode may take the shape of barbed wire, wide metallic strips, and serrated plates or non-serrated plates having sharp or thin parts that facilitate ion production at the portion of the electrode with the small radius of curvature when high voltage is applied. In general, corona discharge electrodes may be fabricated in a wide range of materials. For example, in some embodiments, compositions such as described in U.S. Pat. No. 7,157,704, filed Dec. 2, 2003, entitled "Corona Discharge Electrode and Method of Operating the Same" and naming Krichtafovitch et al. as inventors may be employed. U.S. Pat. No. 7,157,704 is incorporated herein for the limited purpose of describing materials for some emitter electrodes that may be employed in some corona discharge-type embodiments. In general, a high voltage power supply creates the electric field between corona discharge electrodes and collector electrodes.

EHD fluid mover designs described herein include ion collection surfaces positioned downstream of one or more corona discharge electrodes. Often, ion collection surfaces of an EHD fluid mover portion include leading surfaces of generally planar collector electrodes extending downstream of the corona discharge electrode(s). In some cases, a collector electrode may do double-duty as heat transfer surfaces. In some cases, a fluid permeable ion collection surface may be provided.

In general, collector electrode surfaces may be fabricated of any suitable conductive material, such as aluminum or copper. Alternatively, as disclosed in U.S. Pat. No. 6,919,698 to Krichtafovitch, collector electrodes (referred to therein as "accelerating" electrodes) may be formed of a body of high resistivity material that readily conducts a corona current, but for which a result voltage drop along current paths through the body of high resistivity collector electrode material provides a reduction of surface potential, thereby damping or limiting an incipient sparking event. Examples of such relatively high resistance materials include carbon filled plastic, silicon, gallium arsenide, indium phosphide, boron nitride, silicon carbide, and cadmium selenide. U.S. Pat. No. 6,919,698 is incorporated herein for the limited purpose of describing materials for some collector electrodes that may be employed in some embodiments. Note that in some embodiments described herein, a surface conditioning or coating of high resistivity material (as contrasted with bulk high resistivity) may be employed.

Thin, Low-Profile or High-Aspect-Ratio Devices, Generally

FIG. 1A is perspective view of an illustrative, pad-type, consumer electronics device 100 with total thickness d of less than about 10 mm and in which a display surface 101 covers substantially an entire major surface thereof. FIG. 1A illustrates exemplary air flows 102 that may be motivated through the consumer electronics device by an EHD air mover 110 designed and packed within the limited interior in accord with some inventive concepts of the present inventions. In some implementations, available interior volumes and/or assemblies may allow only 5 mm or less of the total thickness d for EHD air mover 110. Of course, positions illustrated for inflow(s), outflow(s) and heat transfer surfaces 120 are purely exemplary and, more generally, ventilation boundaries may be dictated by interior placement of components, thermal challenges of a particular device configuration and/or industrial design factors.

Figure 1C:
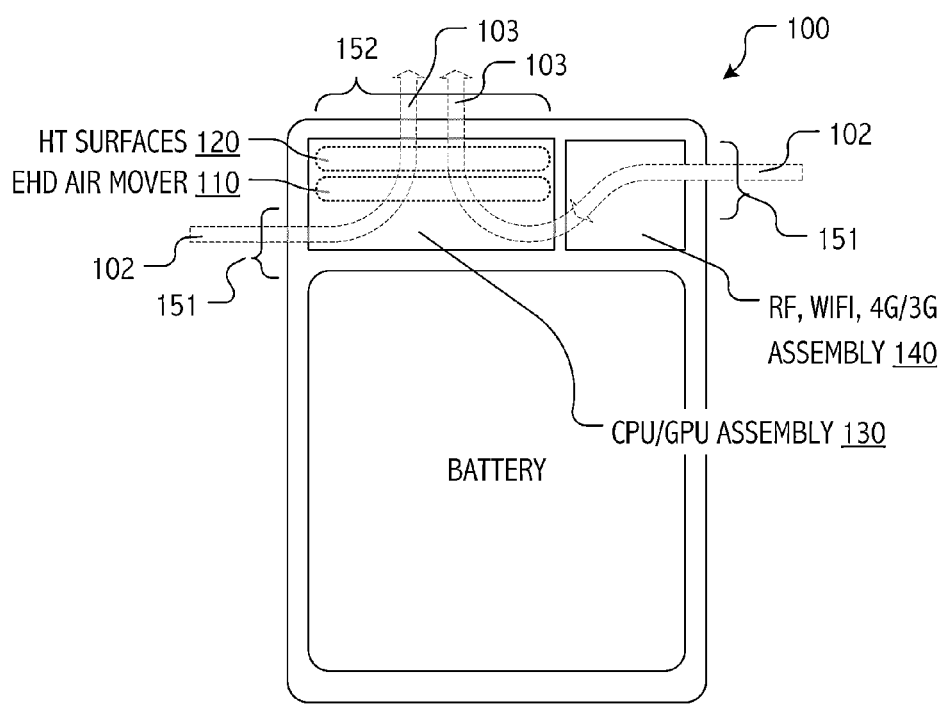
FIG. 1C illustrates another illustrative ventilating air flow topology and placement of an EHD fluid mover relative to respective electronic assemblies.

FIG. 1B illustrates (in top plan view with the display surface removed) an air flow topology and placement of EHD air mover 110 relative to an illustrative design in which respective electronic assemblies 130, 140 (or circuit boards) for processors (e.g., CPU, GPU, etc.) and/or radio frequency (RF) sections (e.g., WiFi, WiMax, 3G/4G voice/data, GPS, etc.) are positioned toward an upper edge of device 100 and in which certain edge-positioned ventilation boundaries (e.g., inlet 151 and outlet 152) are provided. FIG. 1C illustrates another illustrative ventilating air flow topology and placement of an EHD air mover 110 relative to respective electronic assemblies and heat transfer surfaces 120. As before, positioning of inlet and outlet ventilation boundaries (151 and 152) is purely exemplary and, more generally, ventilation boundaries may be dictated by interior placement of components, thermal challenges of a particular device configuration and/or industrial design factors.

FIG. 2A is perspective view of another illustrative low-profile, pad-type, consumer electronics device 200 with total thickness d of less than about 10 mm and in which a display surface 101 covers substantially an entire major surface thereof, but in which thermal management is facilitated by a circulating air (or other fluid) flow 202 within the device enclosure, and in which the motivated flow need not transit a ventilation boundary. FIG. 2A illustrates exemplary fluid flows that may be motivated within the consumer electronics device by an EHD fluid mover 210 designed and packed within the limited interior in accord with some inventive concepts of the present inventions. As before, in some implementations, available interior volumes and/or assemblies may allow only 5 mm or less of the total thickness d for EHD fluid mover 210.

Figure 2B:
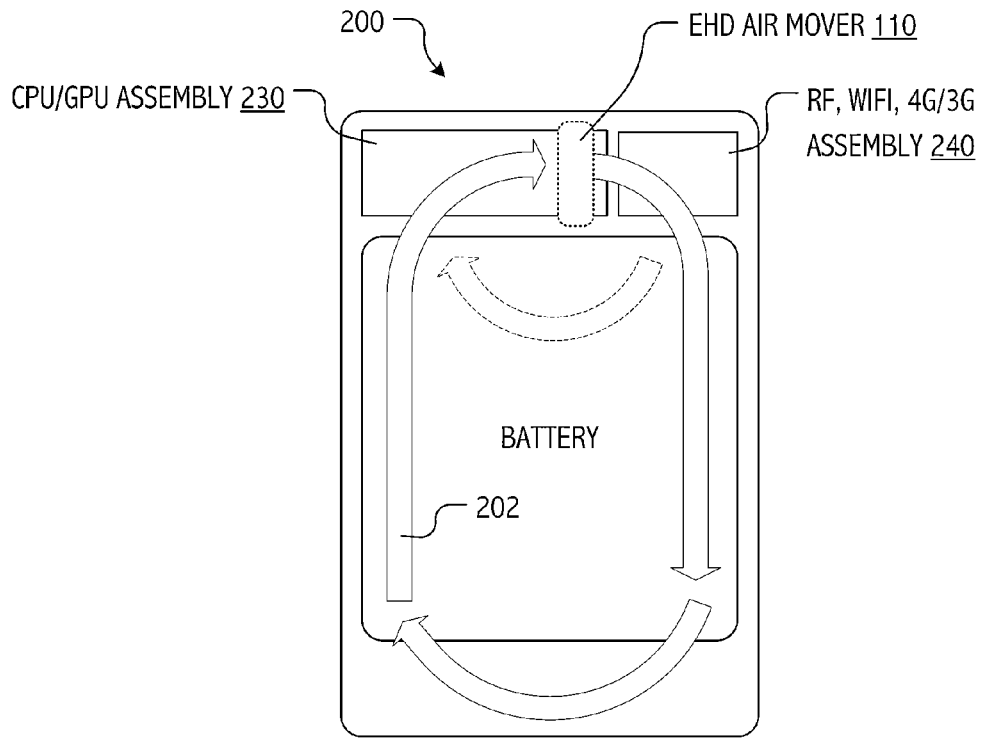
FIG. 2B depicts (in general correspondence with an interior volume of the device of FIG. 2A) an illustrative recirculating fluid flow topology and placement of an EHD fluid mover relative to respective electronic assemblies.
Figure 2C:
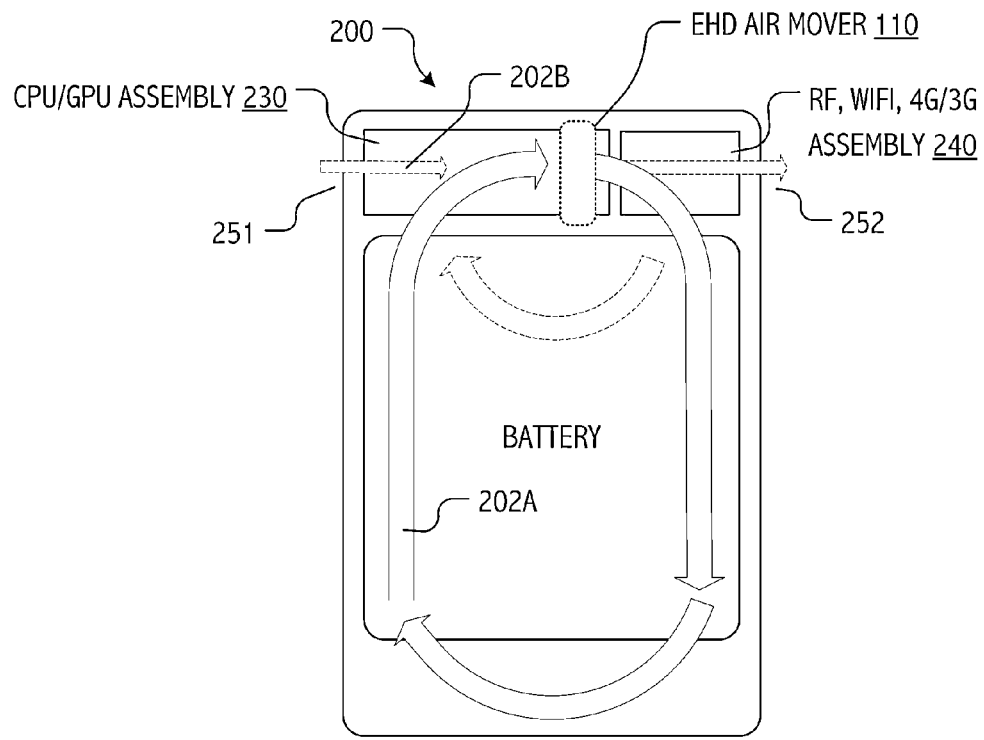
FIG. 2C illustrates a variation in which the flow topology includes both a circulating flow component and some flow that enters and exits the device through ventilation boundaries.

FIG. 2B illustrates (again in top plan view with the display surface removed) an air flow topology contained substantially within the device and an illustrative placement of EHD fluid mover 210 relative to respective electronic assemblies 230, 240 (or circuit boards) for processors and/or radio frequency (RF) sections are positioned toward an upper edge of device 200. Of course, the illustrated flow topology is purely exemplary and, more generally, may be dictated by interior placement of components, thermal challenges of a particular device configuration and/or industrial design factors. FIG. 2C illustrates a variation in which the flow topology include both a circulating flow component 202A and some flow 202B that enters and exits the device through ventilation boundaries 251 and 252.

Figure 7A:
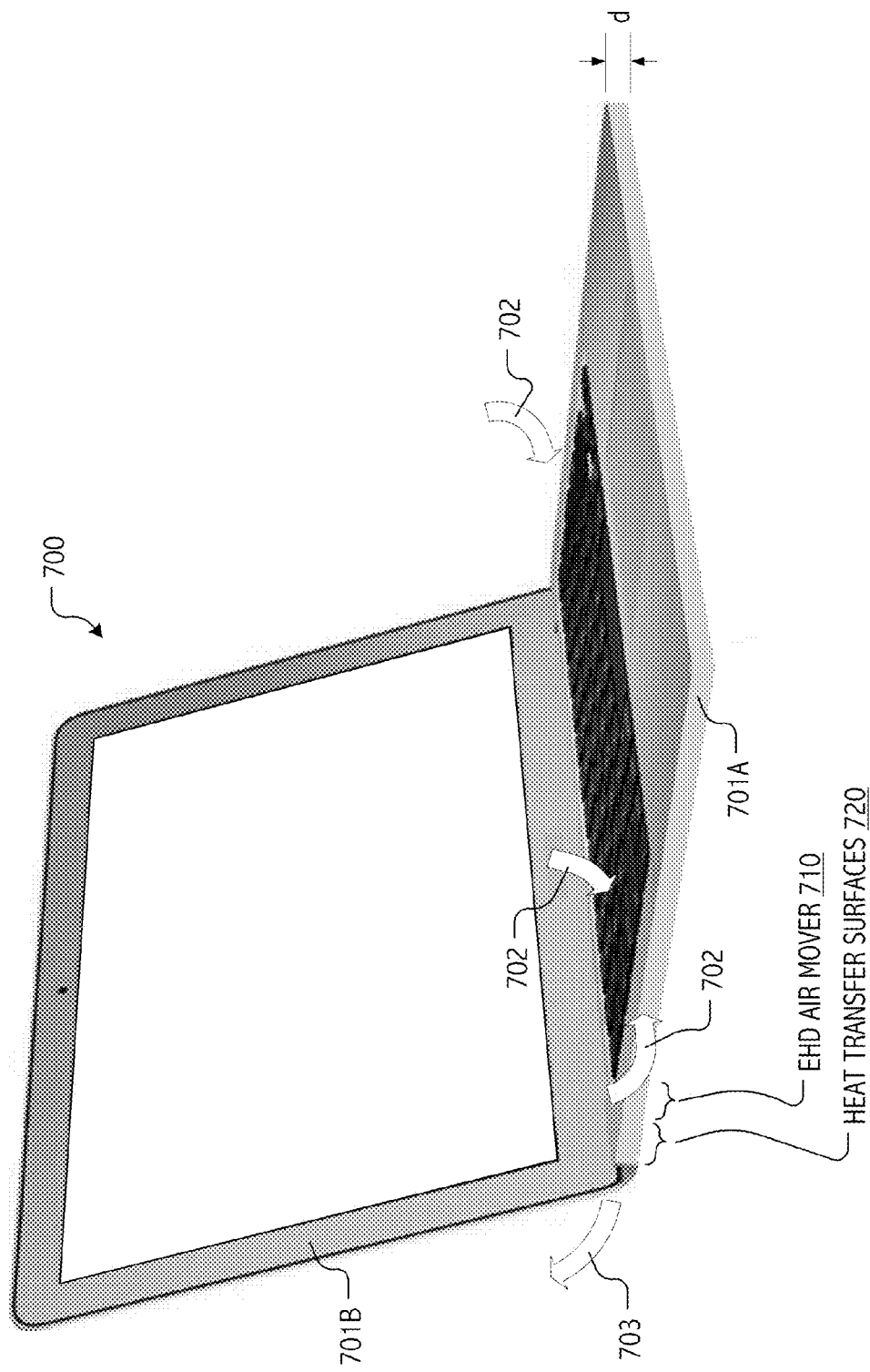
FIG. 7A is a perspective view of an illustrative, laptop-style, consumer electronics device in which, in accord with some embodiments of the present invention, an EHD fluid mover is accommodated within a total device thickness of typically less than about 10 mm.

Other thin, low-profile or high-aspect-ratio devices are also contemplated. For example, FIG. 7A is a perspective view of an illustrative, laptop-style, consumer electronics device 700 in which, in accord with some embodiments of the present invention, an EHD fluid mover is accommodated within a body portion 701A having a total thickness d of less than about 10 mm. FIG. 7A illustrates exemplary inflows 702 and outflows 703 that may be motivated through the consumer electronics device by an EHD air mover 710 designed and packed within the limited interior in accord with some inventive concepts of the present inventions. In some implementations, available interior volumes and/or assemblies may allow only 5 mm or less of the total thickness d for EHD air mover 710. Of course, positions illustrated for inflow(s), outflow(s) and heat transfer surfaces 720 are purely exemplary and, more generally, ventilation boundaries may be dictated by interior placement of components, thermal challenges of a particular device configuration and/or industrial design factors.

Figure 7B:
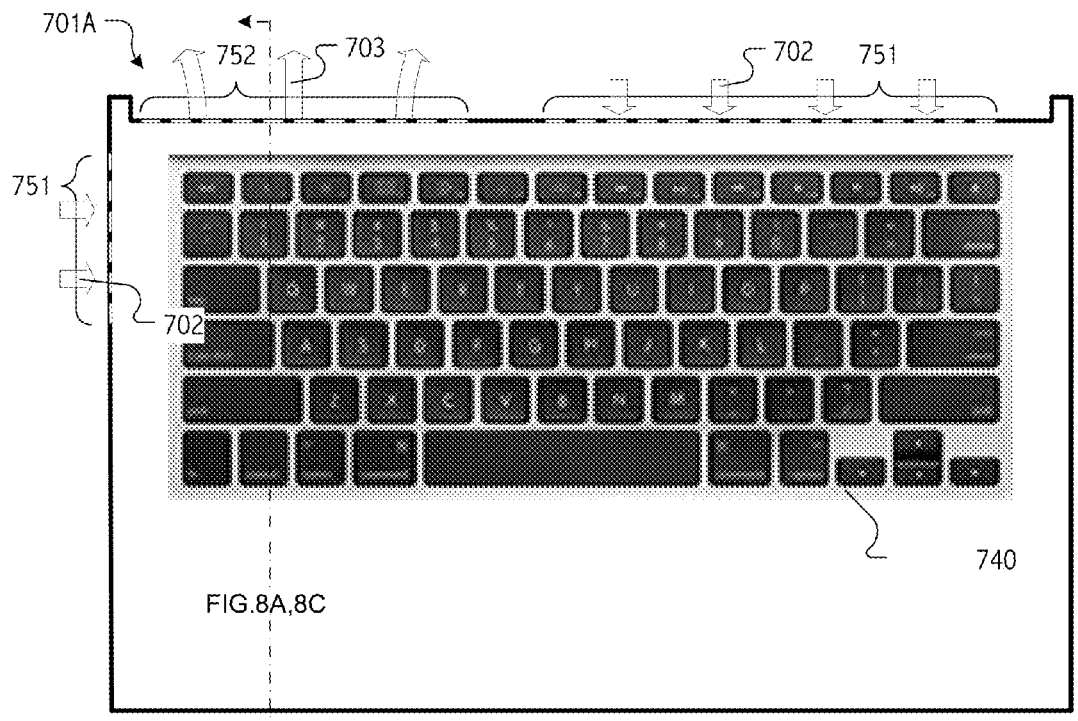
FIGS. 7B and 7C depict (in respective plan views and generally in correspondence with a base portion the laptop-style device of FIG. 7A) illustrative positional relations between components and ventilating air flows.
Figure 7C:
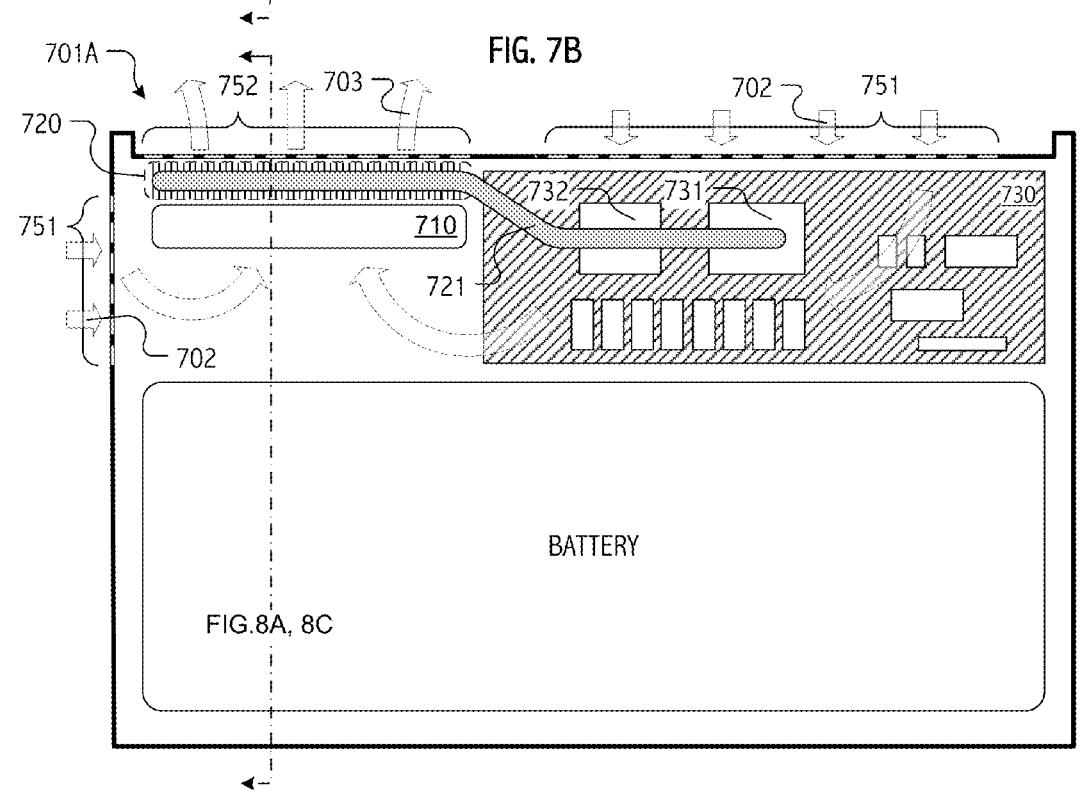

FIGS. 7B and 7C illustrate (in top plan view) air flow topologies and placement of an EHD air mover 710 relative to an illustrative design in which respective electronic assemblies, such as a keyboard assembly 740 and a circuit board 730 for processors (e.g., CPU, GPU, etc.) and/or radio frequency (RF) sections (e.g., WiFi, WiMax, 3G/4G voice/data, GPS, etc.) are positioned toward an upper edge of body portion 701A and in which certain edge-positioned ventilation boundaries (e.g., inlets 751 and outlet 752) are provided. In the views of FIGS. 7B and 7C, display portion 701B has been eliminated for clarity. In the view of FIG. 7C, keyboard assembly 740 and an upper surface of body portion 701A are also removed to reveal an illustrative interior layout and illustrative internal air flows motivated (i.e., forced or drawn) by EHD air mover 710 over circuit board 730 and/or heat transfer surfaces 720. Heat pipe (or spreader) 721 provides a heat transfer path from selected thermal sources on circuit board 730 (e.g., CPU 731 and graphics unit 732) to heat transfer surfaces 720, while air flows drawn over circuit board 730 by EHD air mover 710 provide additional cooling.

Figure 10B:
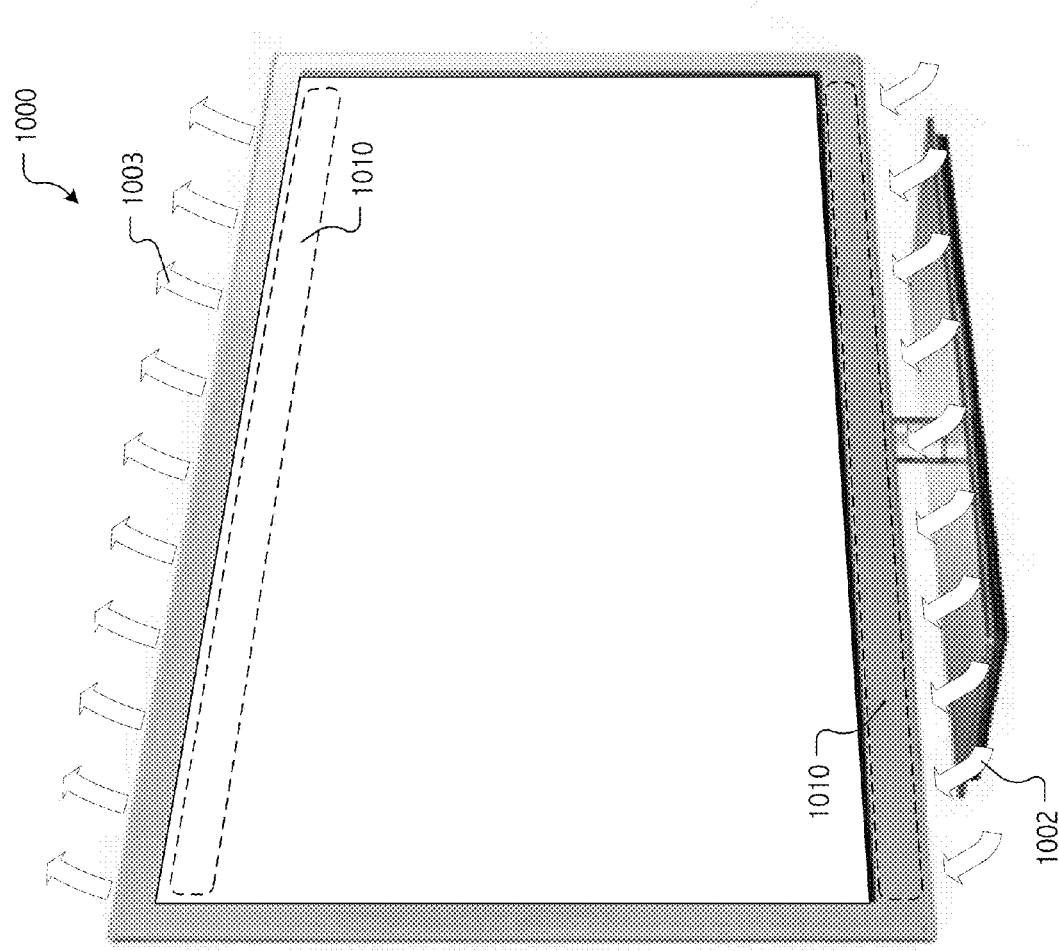
FIGS. 10A and 10B are respective edge-on side and perspective views of an illustrative, flat panel display style, consumer electronics device in which, in accord with some embodiments of the present invention, an EHD fluid mover is accommodated within a total device depth typically less than about 10 mm.
Figure 10A:
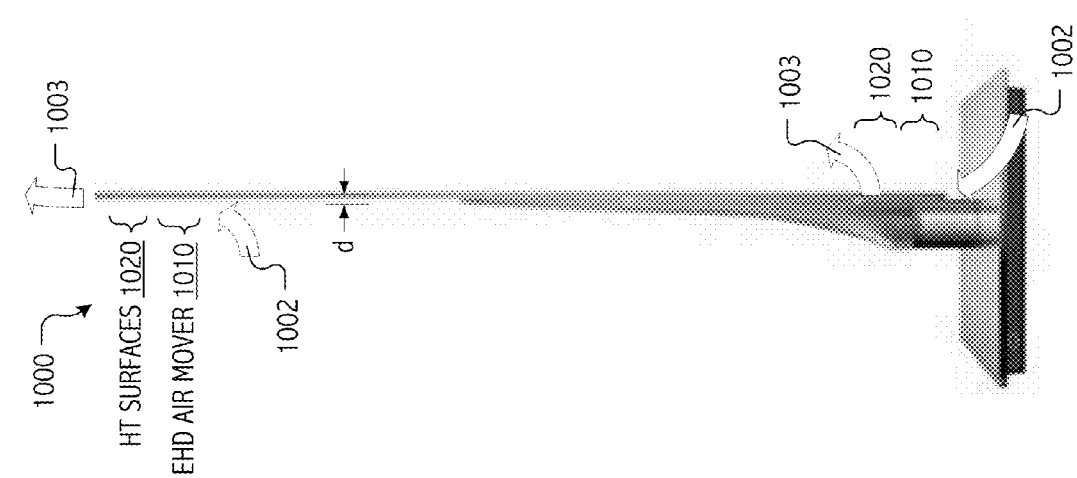

Turning to still another type of devices contemplated, FIGS. 10A and 10B are respective edge-on side and perspective views of an illustrative, flat panel display style, consumer electronics device 1000 in which, in accord with some embodiments of the present invention, an EHD fluid mover is accommodated within a body portion 701A having total thickness d of less than about 10 mm. FIG. 10A illustrates exemplary inflows 1002 and outflows 1003 that may be motivated through the consumer electronics device by EHD air movers 1010 designed and packed within the limited interior in accord with some inventive concepts of the present inventions. In some implementations, available interior volumes and/or assemblies may allow only 5 mm or less of the total thickness d for EHD air mover 1010.

Figure 11A:
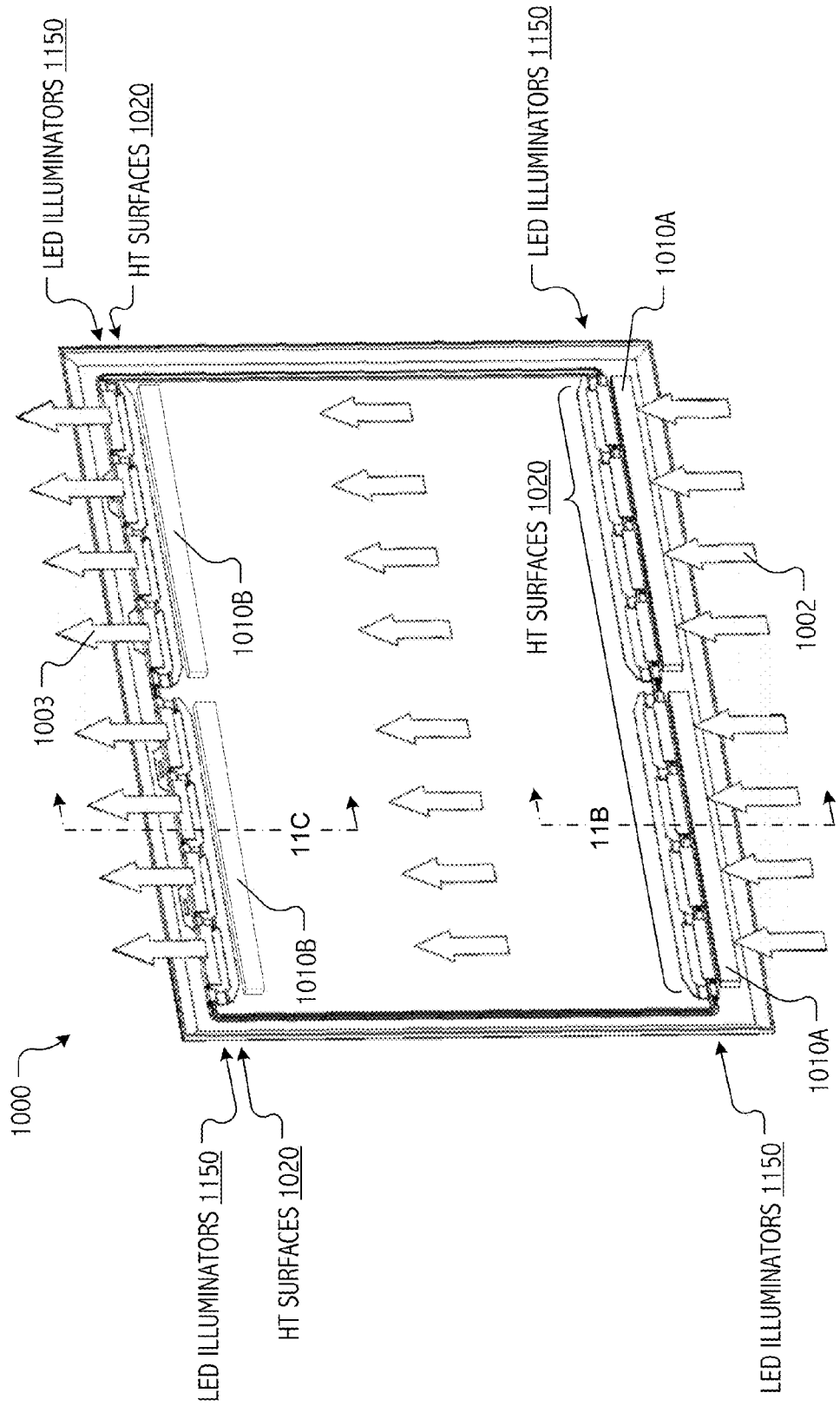
FIG. 11A is an interior view (generally in correspondence with flat panel display device of FIGS. 10A and 10B) illustrating positional relations between components and ventilating air flows.

Of course, positions illustrated for inflow(s), outflow(s) and heat transfer surfaces 1020 are purely exemplary and, more generally, ventilation boundaries may be dictated by interior placement of components, thermal challenges of a particular device configuration and/or industrial design factors. FIG. 11A depicts one embodiment generally in accord with FIGS. 10A and 10B, in which elongate, edge-positioned arrays of illumination sources (LED illuminators 1150) generate heat which, during operation, is convectively transferred by way of heat transfer surfaces 1020 into air flows (1002, 1003) motivated by EHD air movers 1010A, 1010B. In the illustrated configuration, bottom-mounted EHD air mover instances (1010A) force air into the enclosure at the bottom of consumer electronics device 1000, while top-mounted EHD air mover instances (1010B) exhaust air from the top.

The pad-type, laptop-style and television-style consumer electronics device embodiments described above are merely illustrative. Indeed, based on the present description, persons of ordinary skill in the art will appreciate these and other device exploitations of inventive concepts of the present inventions including variations and/or adaptations appropriate for particular form factors, electronic assembly types and placements, thermal challenges and/or industrial design factors that pertain to a given design. In view of the foregoing, we now turn to EHD air mover designs suitable for integration within the limited thicknesses of the illustrated consumer electronics device.

EHD Air Mover Designs

Pad-Type Device Embodiments

Figure 3:
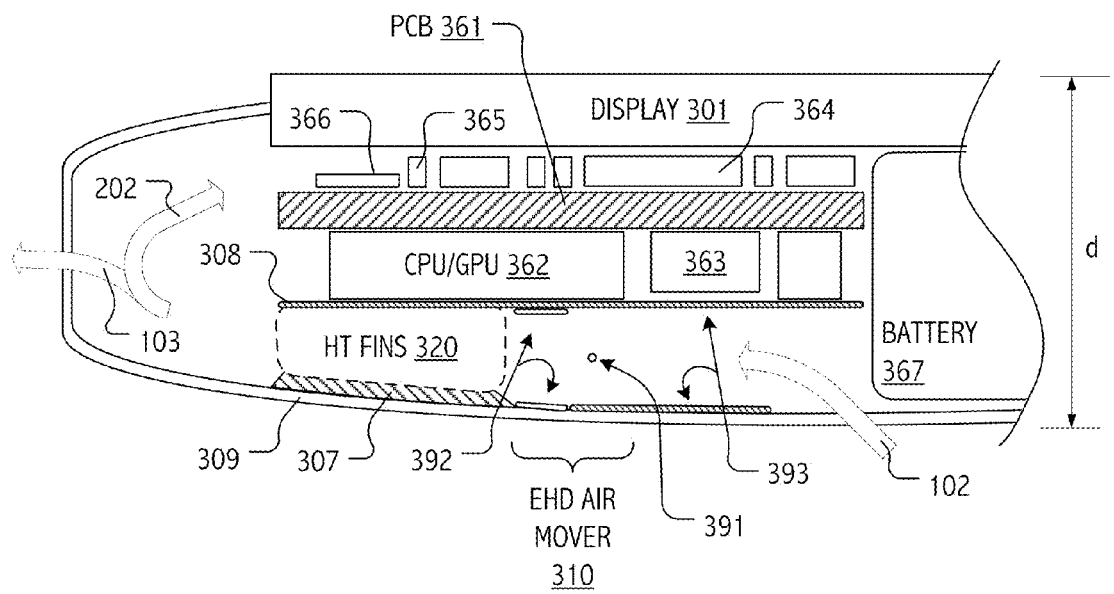
FIGS. 3, 5 and 6 depict, in illustrative cross-sections, device configurations in which electrostatically operative portions of an EHD fluid mover are formed as, or on, respective surfaces of a device enclosure and/or Electromagnetic Interference (EMI) shield overlaying an electronic assembly.
Figure 5:
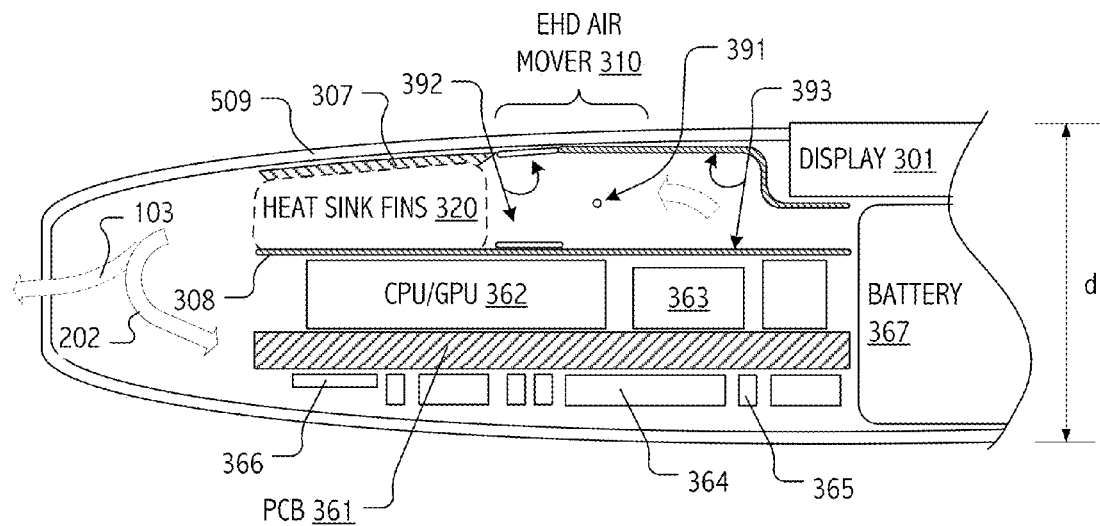
Figure 6:
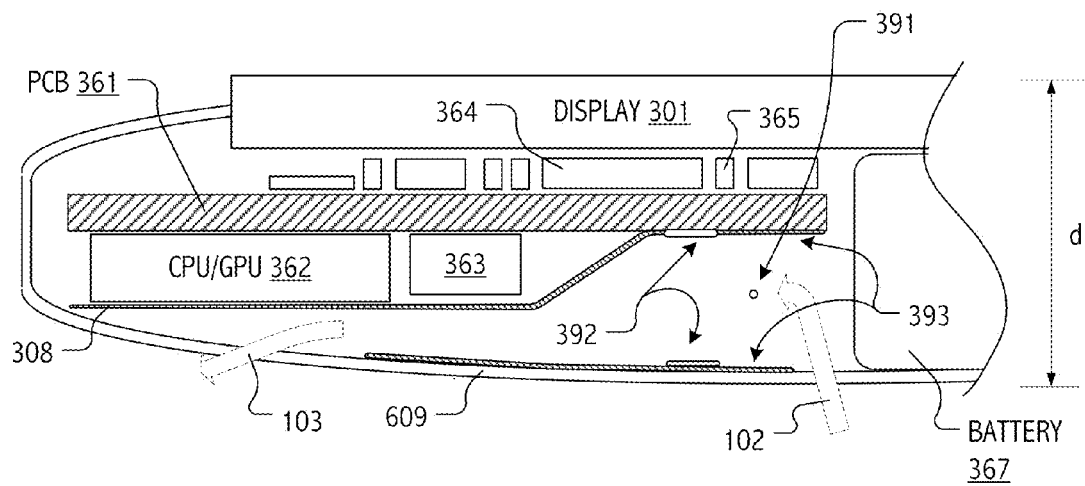

Referring back generally to FIG. 1A and the illustrative pad-type, consumer electronics device 100 depicted therein, we now illustrate (in cross-section) by way of FIGS. 3, 5 and 6, several EHD fluid (or air) mover configurations in which electrostatically operative portions of the design are formed as, or on, a surface within the device enclosure. In some cases, at least one of the electrostatically operative portions is formed as, or on, an interior surface of the enclosure itself. In some cases, at least one of the electrostatically operative portions is formed as, or on, a surface of an EMI shield that overlays an electronics assembly such as a circuit board or display device. In each case, by forming electrostatically operative portions as, or on, such surfaces, EHD fluid/air movers can be accommodated within very limited interior spaces.

For example, in thin, low-profile or high-aspect-ratio consumer electronics devices such as illustrated in FIGS. 3, 5 and 6, total thickness d may preferably be less than about 10 mm, with printed circuit board (PCB) mounted integrated circuits, discretes, connectors, etc. occupying a substantial portion of the available interior space. Examples of PCB mounted integrated circuits include central processor units (CPUs), graphics processor units (GPUs), communications processors and transceivers, memory, etc., which can often generate a substantial portion of the devices heat load and which, in some embodiments, are cooled by the very EHD fluid/air movers that can be accommodated closely proximate to the heat sources (or thermally coupled fins/spreaders).

In some cases, such as illustrated in FIG. 3, it is desirable to accommodate (i) a display 301, (ii) a double-sided PCB 361 (with its affixed integrated circuits [362, 363, 364], discretes 365 and connectors 366) and (iii) an EHD air mover 310 all within a device stack and volume at least partially bounded by enclosure 309. Although available interior volumes and tolerances are, in general, implementation and design dependent, it should be clear from the illustrations and description herein that a consumer electronics device may afford 5 mm or less of its total thickness d for EHD air mover 310. In some embodiments, heat transfer (HT) fins 320 are also dimensioned to fit within the limited thickness provided.

Figure 4:
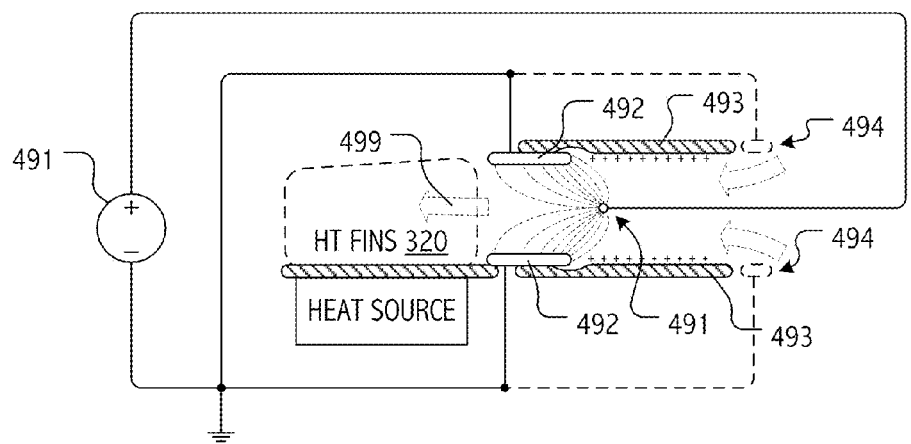
FIG. 4 depicts an illustrative high voltage power supply configuration in which emitter and collector electrodes are energized to motivate fluid flow.

FIG. 4 depicts (in schematic form) an illustrative configuration in which a high voltage power supply 491 is coupled between an emitter electrode 491 and collector electrodes 492 to generate an electric field and in some cases ions that motivate fluid flow 499 in a generally downstream direction. In the illustration, emitter electrode 491 is coupled to a positive high voltage terminal of power supply 491 (illustratively +3.5 KV, although specific voltages and, indeed, any supply voltage waveforms may be matters of design choice) and collector electrodes 492 are coupled to a local ground. See previously incorporated U.S. Pat. No. 6,508,308 for a description of suitable designs for power supply 491. Given the substantial voltage differential and short distances involved (perhaps 1 mm or less) between emitter electrode 491 and leading surfaces of collector electrodes 492, strong electrical fields are developed which impose a net downstream motive force on positively charged ions (or particles) in the fluid. Field lines illustrate (generally) spatial aspects of the resulting electric field and spacing of the illustrated field lines is indicative of intensity.

As will be understood by persons of ordinary skill in the art, corona discharge principles may be employed to generate ions in the intense electric field closely proximate the surface of a corona-discharge type emitter electrode. Thus, in corona discharge type embodiments in accord with FIG. 4, fluid molecules (such as surrounding air molecules) near emitter electrode 491 become ionized and the resulting positively charged ions are accelerated in the electric field toward collector electrodes 492, colliding with neutral fluid molecules in the process. As a result of these collisions, momentum is transferred from the ions to neutral fluid molecules, inducing a corresponding movement of fluid molecules in a net downstream direction. While the positively charged ions are attracted to, and neutralized by, collector electrodes 492, the neutral fluid molecules move past collector electrodes 492 at an imparted velocity (as indicated by fluid flow 499). The movement of fluid produced by corona discharge principles has been variously referred to as "electric," "corona" or "ionic" wind and has generally been defined as the movement of gas induced by the movement of ions from the vicinity of a high voltage discharge electrode.

Notwithstanding the descriptive focus on corona discharge type emitter electrode configurations, persons of ordinary skill in the art will appreciate that ions may be generated by other techniques such as silent discharge, AC discharge, dielectric barrier discharge (DBD), or the like, and once generated, may, in turn, be accelerated in the presence of electrical fields to motivate fluid flow as described herein. For avoidance of doubt, emitter electrodes need not be of a corona discharge type in all embodiments. Also for avoidance of doubt, power supply voltage magnitudes, polarities and waveforms (if any) described with respect to particular embodiments are purely illustrative and may differ for other embodiments.

Some embodiments described herein will be further understood in light of certain surfaces provided upstream of emitter electrode 491 to shape the electric previously described electric field and/or to provide a barrier to upstream migration of ions. For example, relative to the illustration of FIG. 4, dielectric surfaces 493 are provided on which positively charge (such as from ions generated at a corona discharge type instance of emitter electrode 491 or elsewhere) tends to accumulate. Because dielectric surfaces 493 do not provide an attractive path to ground, a net positive charge tends to accumulate and thereafter operate electrostatically to repel like charges. As a result, dielectric surfaces 493 are electrostatically operative as a barrier to upstream ion migration. Upstream dielectric surfaces 493 also tend to electrostatically mask any otherwise attractive paths to ground, thereby shaping the previously described electric field in the primarily downstream direction toward collector electrodes 492. To improve performance, an air gap may be provided between leading edges of collector electrodes 492 and adjacent portions of dielectric surfaces 493. For example, in some embodiments, an air gap may be provided in the form of a shallow trench formed in dielectric surfaces 493 as illustrated in FIG. 4. Optionally, in some embodiments, one or more conductive paths 494 to ground may be provided further upstream of dielectric surfaces 493 to capture ions that may nonetheless migrate upstream. In some ventilated device embodiments, such a conductive path 494 to ground may be provided proximate an inlet vent.

Building on the preceding description, but now referring back to FIG. 3, it has been discovered that, given the very limited thickness that may be available to a thermal management solution within the interior of commercially desirable form factors, designs in which electrostatically operative surfaces such as a collector electrode or a field shaping, charge collecting surface are formed as, or on, an exposed surface tend to save precious millimeters of thickness that would otherwise be squandered in a more conventional design in which electrodes might be packaged within the walls of an EHD air mover subassembly. In this regard, FIG. 3 illustrates a design in which a pair of generally planar collector electrodes 392 is formed on opposing surfaces to establish, with emitter electrodes 391 and when energized with a high voltage power supply as previously described with reference to FIG. 4, a generally downstream EHD motivated air flow.

In the illustrated configuration, a first, lower, instance of collector electrode 392 is formed on or as part of an interior surface of enclosure 309. For example, in some embodiments, a conductive (e.g., metallic) tape or strip may be affixed to the interior surface of a generally non-conductive case or surface thereof and coupled to ground to define the first collector electrode instance. In general, the conductive tape or strip may be cut to a shape and extent desired for collector electrode 392. Alternatively, a non-conductive (e.g., dielectric) layer otherwise overlaying a grounded conductive (e.g., metallic) layer or region may be etched or otherwise selectively removed to expose a surface of the shape and extent desired for collector electrode 392. In some cases, the grounded conductive layer or region may be, or may be formed integrally with, enclosure 309.

A second, upper, instance of collector electrode 392 is likewise formed on or as part of an EMI shield 308 that isolates EHD air mover 310 from the integrated circuits (362, 363, 364), discretes 365 and/or connectors 366 affixed to double-sided PCB 361. A conductive (e.g., metallic) tape or strip may be affixed to an otherwise non-conductive exposed surface of EMI shield 308 and coupled to ground to define the second collector electrode instance. As before, the conductive tape or strip may be cut to a shape and extent desired for collector electrode 392. Alternatively, a non-conductive (e.g., dielectric) layer otherwise overlaying a grounded conductive (e.g., metallic) interior layer or region of EMI shield 308 may be etched or otherwise selectively removed to expose a surface of the shape and extent desired for collector electrode 392.

As with collector electrodes 392, respective upper and lower instances of dielectric surfaces 393 are provided on, or as part of, a surface of EMI shield 308 or enclosure 309. As previously described with reference to FIG. 4, such dielectric surfaces are electrostatically operative and contribute to field shaping in the EHD fluid mover while also providing a barrier to ion migration upstream. In particular, during operation of EHD fluid mover 310, dielectric surfaces 393 accumulate charge (such as from positive ions generated at a corona discharge type instance of emitter electrode 391 or elsewhere). Because dielectric surfaces 393 do not provide an attractive path to ground, a net charge tends to accumulate and thereafter operate electrostatically to repel like charges. As a result, dielectric surfaces 393 are electrostatically operative as a barrier to upstream ion migration. Upstream dielectric surfaces 393 also tend to electrostatically mask any otherwise attractive paths to ground, such as may be provided by traces formed on PCB 361, components affixed thereto, battery 367, enclosure 309 or other electronic components not specifically shown, thereby shaping the previously described electric field in the primarily downstream direction toward collector electrodes 492.

As with the collector electrodes 392, dielectric surfaces 393 may be formed on the aforementioned surfaces or integrally therewith. In each case, by forming the electrostatically operative surfaces that define collector electrodes 392 and dielectric surfaces 393 as, or on, the aforementioned surfaces, EHD air mover 310 can be included within very limited interior spaces such as illustrated in FIG. 3. In some embodiments, one or more of the illustrated dielectric surfaces are provided as a polyimide film or tape, such as marketed by E. I. du Pont de Nemours and Company under the KAPTON trademark, affixed over respective portions of an EMI shield or an enclosure.

Note that, in some embodiments, at least a portion of the surface 308 on, or over, which the second, upper, instances of collector electrode 392 and dielectric field shaping surface 393 are formed may be configured to act as a heat spreader as well as an EMI shield. In some cases, such a heat spreader may optionally be provided with heat transfer fins 320 as depicted in FIG. 3. In such cases and depending on dimensional clearances, it may be desirable to provide a thermal buffer 307 (e.g., of closed-cell foam or other thermally insulative material) to avoid hot spotting on the exterior of enclosure 309 and to guide the EHD motivated fluid flow through heat transfer fins 320. For generality, both ventilating and recirculating fluid flow paths are depicted, although based on the description herein, persons of ordinary skill in the art will appreciate that one, the other, or both of ventilating and recirculating flow paths may be provided in any given design.

FIGS. 5 and 6 depict cross-sectional views of additional variations on the described device configurations in which electrostatically operative portions of an EHD fluid mover are formed as, or on, respective surfaces of a device enclosure and/or Electromagnetic Interference (EMI) shield overlaying an electronic assembly. Whereas FIG. 3 depicted a display surface as part of the device stack that includes an EHD fluid mover, FIG. 5 depicts an alternative in which the dimension-setting device stack includes a PCB electronic assembly, with components affixed thereto, and EHD fluid mover positioned between opposing walls of enclosure 509. FIG. 6 depicts a further alternative configuration in one of the collector electrodes of the EHD fluid mover is provided using a trace formed on the PCB of an electronic assembly included within enclosure 609. For ease of understanding, like features are depicted using reference numerals already described with reference to FIGS. 3 and 4. Based on that preceding description, persons of ordinary skill in the art will appreciate the variations depicted in FIGS. 5 and 6.

Laptop-Style Embodiments

Referring back generally to FIGS. 7A, 7B and 7C and the illustrative laptop-style, consumer electronics device 700 (and body portion 701A) depicted therein, we now illustrate (in cross-section) by way of FIGS. 8A, 8C, 9A and 9B, EHD air mover configurations in which electrostatically operative portions of the design are formed as, or on, a surface within the device enclosure. In some cases, at least one of the electrostatically operative portions is formed as, or on, an interior surface of the enclosure itself. In some cases, at least one of the electrostatically operative portions is formed as, or on, a surface of an EMI shield that overlays an electronics assembly such as a keyboard assembly or circuit board. In each case, by forming electrostatically operative portions as, or on, such surfaces, EHD fluid/air movers can be accommodated within very limited interior spaces.

Figure 8A:
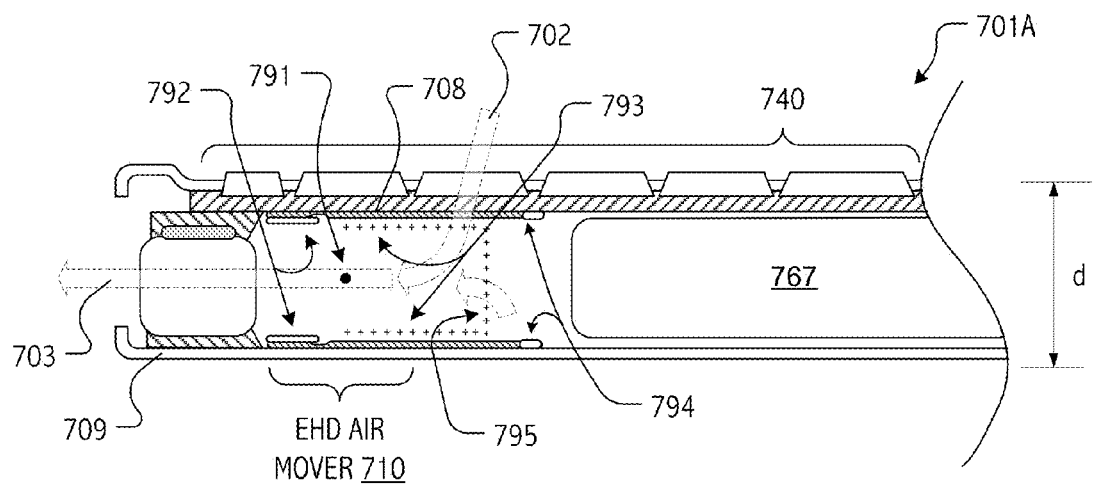
FIGS. 8A and 8C depict, in illustrative cross-sections, a device configuration in which electrostatically operative surfaces of an EHD air mover are formed as, or on, respective surfaces of a device enclosure and/or Electromagnetic Interference (EMI) shield underlying an electronic assembly. In some realizations, FIG. 8A corresponds generally to a cross-section shown in FIGS. 7B and 7C.
Figure 8B:
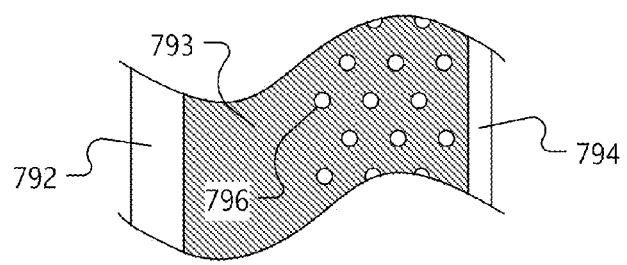
FIG. 8B depicts a partial interior view of an electrostatically operative, air-flow-permeable surface of the EHD air mover illustrated in FIG. 8A.
Figure 8C:
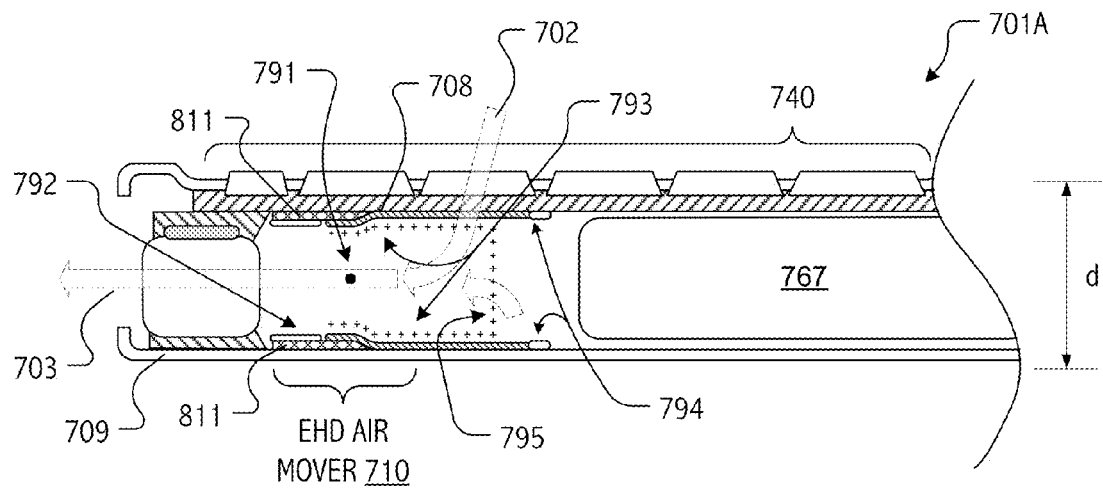

For example, in consumer electronics devices such as illustrated in the FIGS. 8A and 8C cross-sections of body portion 701A, total thickness d may be less than about 10 mm, with keyboard assembly 740 occupying a portion of the available vertical section. Recalling the plan view layout of FIG. 7C, the illustrated cross-sections of FIGS. 8A and 8C allow the substantial entirety of the interior vertical section to accommodate EHD air mover 710. On the other hand, analogous, but more tightly packed, vertical sections illustrated in FIGS. 9A and 9B accommodate EHD air mover 710 as well as printed circuit board (PCB) mounted integrated circuits, discretes, connectors, etc. occupying a substantial portion of the available interior space. As before, examples of PCB mounted integrated circuits include central processor units (CPUs), graphics processor units (GPUs), communications processors and transceivers, memory, etc., which can often generate a substantial portion of the devices heat load and which, in some embodiments, are cooled by the very EHD fluid/air movers that can be accommodated closely proximate to the heat sources (or thermally coupled fins/spreaders).

Turning first to the FIG. 8A cross-section, a pair of generally planar collector electrodes 792 is formed as, or on, opposing interior surfaces of base portion 701A. More specifically, a first, lower instance of collector electrode 792 is formed on or as part of an interior surface of enclosure 709. As before, in some embodiments, a conductive (e.g., metallic) tape or strip may be affixed to the interior surface of a generally non-conductive case or surface thereof and coupled to ground to define the first collector electrode instance. In general, the conductive tape or strip may be cut to a shape and extent desired for collector electrode 792. Alternatively, a non-conductive (e.g., dielectric) layer otherwise overlaying a grounded conductive (e.g., metallic) layer or region may be etched or otherwise selectively removed to expose a surface of the shape and extent desired for collector electrode 792. In some cases, the grounded conductive layer or region may be, or may be formed integrally with, enclosure 709.

A second, upper, instance of collector electrode 792 is likewise formed on or as part of an EMI shield 708 that isolates EHD air mover 710 from keyboard assembly 740. A conductive (e.g., metallic) tape or strip may be affixed to an otherwise non-conductive exposed surface of EMI shield 708 and coupled to ground to define the second collector electrode instance. As before, the conductive tape or strip may be cut to a shape and extent desired for collector electrode 792. Alternatively, a non-conductive (e.g., dielectric) layer otherwise overlaying a grounded conductive (e.g., metallic) interior layer or region of EMI shield 708 may be etched or otherwise selectively removed to expose a surface of the shape and extent desired for collector electrode 792.

Collector electrodes 792 and emitter electrode 791 are coupled between terminals of a high voltage power supply (not specifically shown, but as generally explained relative to FIG. 4) to generate an electric field (and in corona discharge-type embodiments such as illustrated, the ions) that motivate air flow in a generally downstream direction. By way of example, emitter electrode 791 may, in some embodiments, be coupled to a positive high voltage terminal of a power supply (illustratively +3.5 KV, although specific voltages and, indeed, any supply voltage waveforms may be matters of design choice) while collector electrodes 792 are coupled to a local ground. Operation of EHD air mover 710 is substantially as described with reference to FIG. 4.

As with the collector electrodes, respective upper and lower instances of dielectric surfaces 793 are provided on, or as part of, a surface of EMI shield 708 or enclosure 709. These dielectric surfaces are electrostatically operative and contribute to field shaping in the EHD fluid mover while also providing a barrier to ion migration upstream. In particular, during operation of EHD fluid mover 710, dielectric surfaces 793 accumulate charge (such as from positive ions generated at a corona discharge type instance of emitter electrode 791 or elsewhere). As a result, dielectric surfaces 793 are electrostatically operative as a barrier to upstream ion migration. Upstream dielectric surfaces 793 also tend to electrostatically mask any otherwise attractive paths to ground, such as may be part of keyboard assembly 740, battery 767, enclosure 709 itself or other electronic components not specifically shown. In this way, dielectric surfaces 793 shape electric field established by EHD air mover 710 in the primarily downstream direction toward collector electrodes 792.

Note that in the illustration of FIG. 8A, a ventilating inflow 702 of air is drawn through apertures in keyboard assembly 740. FIG. 8B depicts a partial underside view (from within the interior of EHD air mover 710) of apertures 796 in upper dielectric surface 793. Although an exemplary array of circular apertures is illustrated, persons of ordinary skill in the art will appreciate that any of a variety of penetrations (and patterns thereof) through upper dielectric surface 793 may be provided to facilitate ventilating inflow 702. It will also be appreciated that the above-described electrostatically operative accumulation of charge on dielectric surface 793 provides a barrier to migration of ions from EHD air mover 710 though the illustrated apertures and into keyboard assembly 740.

In some embodiments, additional ion migration barriers may be provided. For example, in the illustration of FIG. 8A, an additional ion repelling barrier 795 is introduced as a dielectric mesh, grid, grate or other air permeable curtain across a substantial upstream cross-section of the EHD motivated flow. As before, barrier 795 accumulates charge (such as from positive ions generated at a corona discharge type instance of emitter electrode 791) and operates as an electrostatic barrier to upstream ion migration. In the configuration illustrated, conductive paths 794 to ground are provided to capture ions that may nonetheless migrate upstream past barrier 795.

Figure 8D:
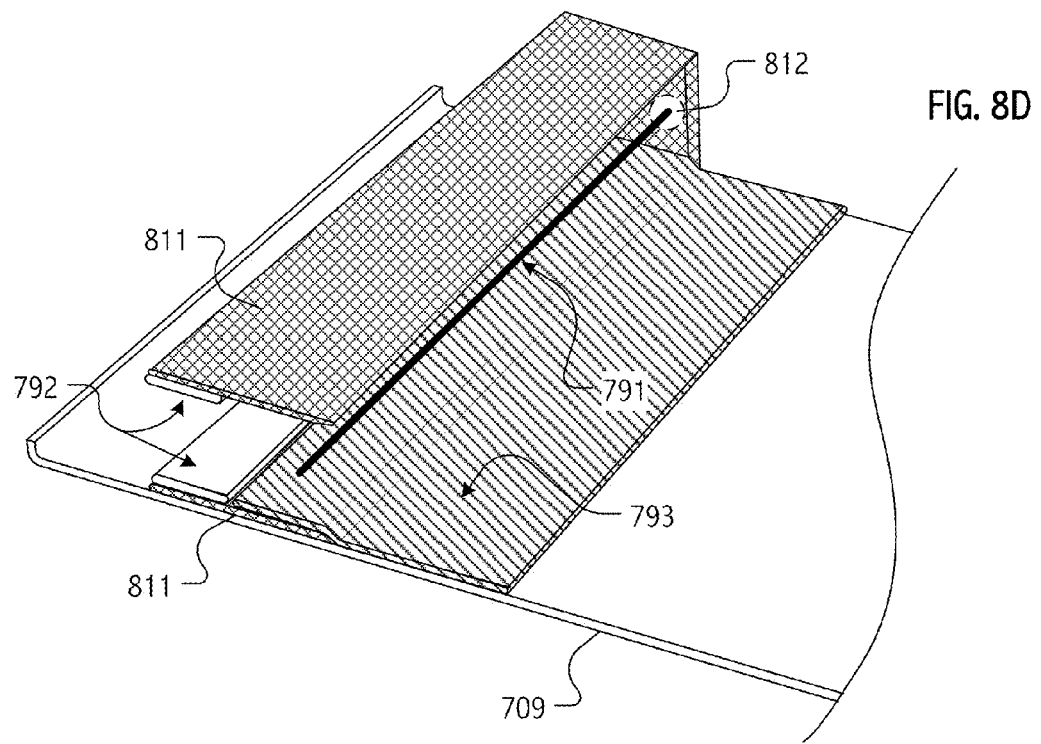
FIG. 8D is a perspective cutaway view corresponding to FIG. 8C.

In some embodiments, subassembly structure (not specifically illustrated in FIG. 8A) may be provided (e.g., to fix position of emitter electrode 791 and collector electrodes 792 with respect to each other). FIG. 8C provides an illustrative view of a cross-section through an illustrative exoskeletal structure 811 (e.g., a partial subassembly enclosure) that provides relative positional fixation of collector electrodes 792 and emitter electrode 791 with respect to each other. Note that fix points (e.g., 812) for respective ends of emitter electrode 791 are necessarily out of view in the illustrated cross-section, but will be better appreciated based on the corresponding perspective cutaway view of FIG. 8D. As before, electrostatically operative upper and lower dielectric surfaces 793 contribute to field shaping in the EHD fluid mover while also providing a barrier to ion migration upstream. However, in the variation of FIG. 8C, these dielectric surfaces 793 lap over a portion of the illustrated exoskeletal structure 811 and conformably extend in an upstream direction where they (as before) are provided on, or as part of, an exposed surface of EMI shield 708 or enclosure 709, respectively. Note that, in the perspective cutaway view of FIG. 8D, only the lower one of the lapped-over electrostatically operative field shaping dielectric surfaces 793 is illustrated. In some embodiments, one or more of the illustrated dielectric surfaces are provided as a polyimide film or tape, such as marketed by E. I. du Pont de Nemours and Company under the KAPTON trademark, affixed over respective portions of an exoskeletal structure of an EHD subassembly, an EMI shield and/or an enclosure.

Figure 9A:
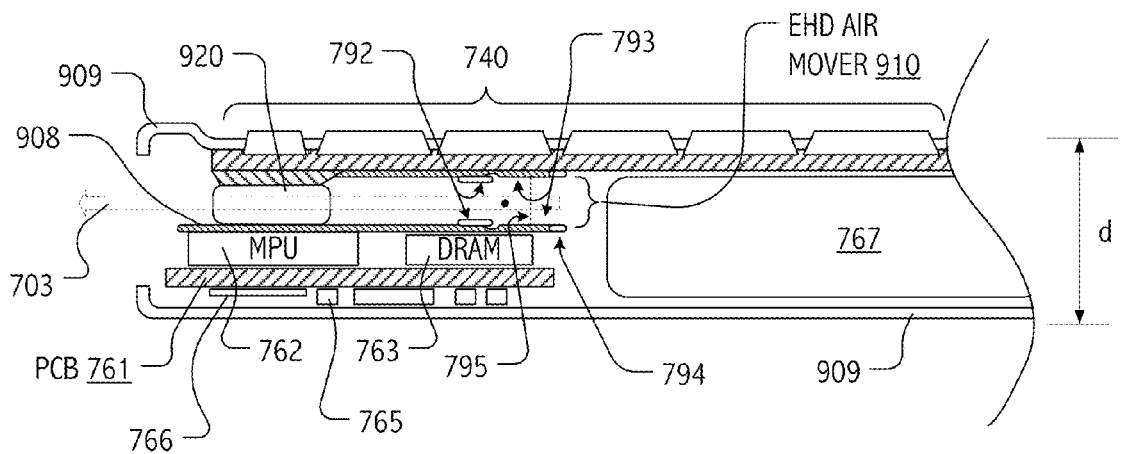
FIGS. 9A and 9B depict, in further illustrative cross-sections, device configurations in which opposing electrostatically operative portions of an EHD fluid mover are formed as, or on, respective surfaces of Electromagnetic Interference (EMI) shields underlying (or overlaying) respective electronic assemblies. In some realizations, FIGS. 9A and 9B correspond to variations in which a circuit board-type electronic assembly is part of the device stack that includes the EHD fluid mover.
Figure 9B:
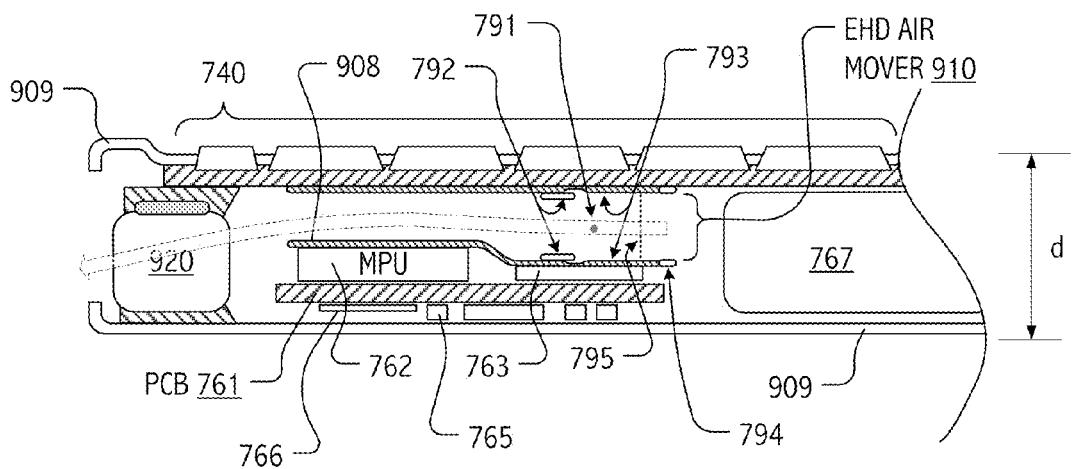

In the embodiments of FIGS. 8A and 8C and as before, given the very limited thickness that may be available to a thermal management solution within the interior of commercially desirable form factors, designs in which electrostatically operative surfaces such as a collector electrode or a field shaping, charge collecting surface are formed as, or on, an exposed surface tend to save precious millimeters of thickness that would otherwise be squandered in a more conventional design in which electrodes might be packaged within the walls of an EHD air mover subassembly. In this regard, FIGS. 9A and 9B illustrate variations on the designs just described in which (i) keyboard assembly 740, (ii) EHD air mover 910 and (iii) a double-sided PCB 761 (with its affixed integrated circuits [multiprocessor 762, memory 763], discretes 765 and connectors 766) are all accommodated within a device stack and volume at least partially bounded by enclosure 909.

Although available interior volumes and tolerances are, in general, implementation and design dependent, it should be clear from the illustrations and description herein that a consumer electronics device may afford 5 mm or less of its total thickness d for EHD air mover 910. In some embodiments (such as illustrated in FIG. 9A), heat transfer fins 920 are dimensioned to fit within the limited thickness provided. In some embodiments (such as illustrated in FIG. 9B), air flow paths may accommodate larger instances of heat transfer fins 920. In each case, by forming the electrostatically operative surfaces that define collector electrodes 792 and/or dielectric surfaces 793 as, or on, the aforementioned surfaces, EHD air mover 910 can be included within very limited interior spaces as illustrated in FIGS. 9A and 9B, respectively.

As before, and though omitted for simplicity of illustration, an exoskeletal structure (e.g., a partial subassembly enclosure) may provide relative positional fixation of collector electrodes 792 and emitter electrode 791 with respect to each other. In such cases, dielectric surfaces 793 (e.g., polyimide film or tape) may lap over a portion of the exoskeletal structure (not specifically shown, but recall FIGS. 8C and 8D) and conformably extend in an upstream direction where they are provided on, or as part of, a surface of an EMI shield 908.

Television or Display Device Embodiments

Figure 11C:
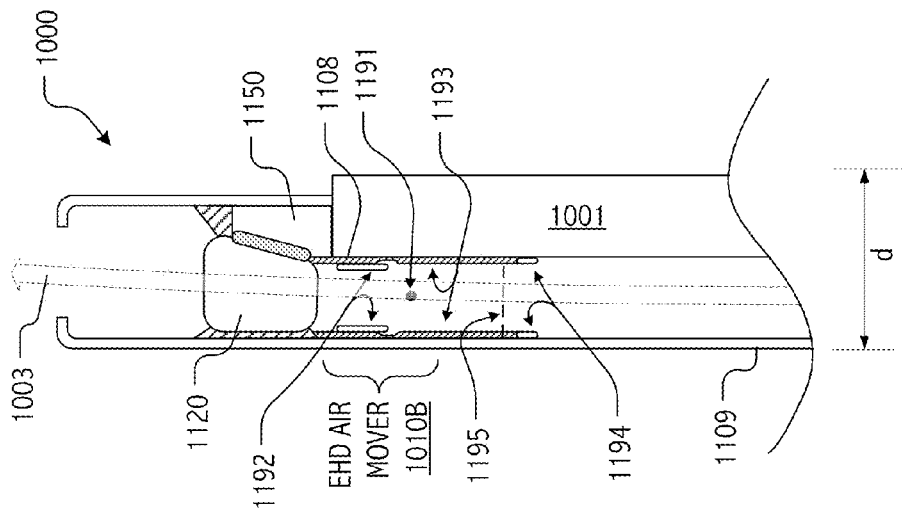
FIGS. 11B and 11C depict, in illustrative cross-sections of the flat panel display device, opposing electrostatically operative portions of respective EHD air movers formed as, or on, respective surfaces of a device enclosure and an Electromagnetic Interference (EMI) shield overlaying a display.
Figure 11B:
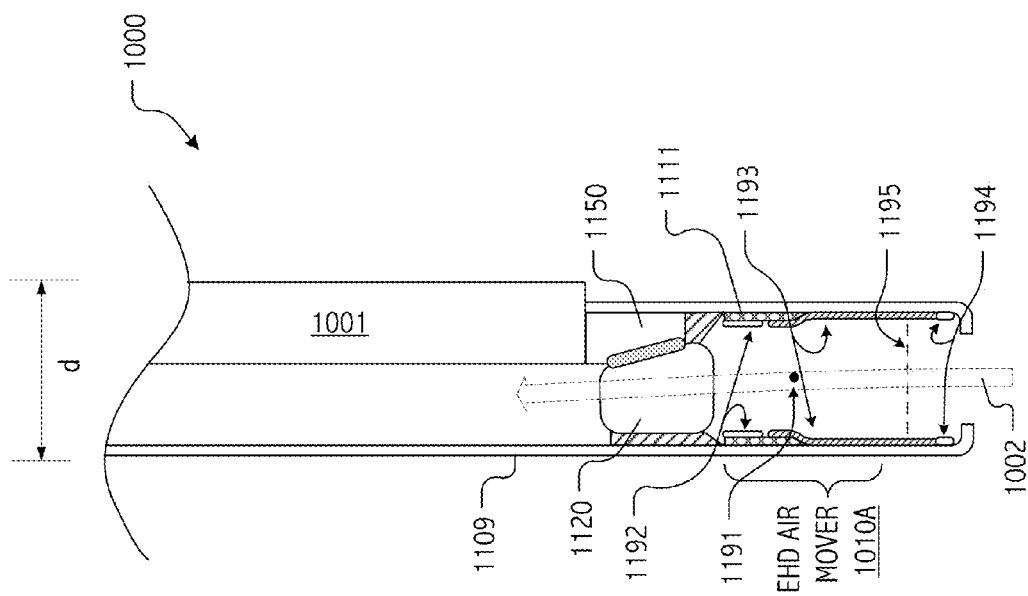

Referring back generally to FIGS. 10A, 10B and 11A and the illustrative flat panel display device 1000 depicted therein, we now illustrate (in cross-section) by way of FIGS. 11B and 11C, EHD air mover configurations for lower and upper portions of the display device in which electrostatically operative portions of the design are formed as, or on, surfaces within the device enclosure. In some cases, at least one of the electrostatically operative portions is formed as, or on, an interior surface of the enclosure itself. In some cases, at least one of the electrostatically operative portions is formed as, or on, a surface of an EMI shield that overlays an electronics assembly such as a display. In each case, by forming electrostatically operative portions as, or on, such surfaces, EHD fluid/air movers can be accommodated within very limited interior spaces.

For example, in flat panel display device 1000, total depth d of cross-sections 11B and 11C, may be less than about 10 mm. Recalling the perspective view of FIG. 11A and the upper and lower instances of EHD air movers depicted therein, FIG. 11B illustrates cross-section 11B in which a substantial entirety of the interior depth accommodates an instance of lower EHD air mover 1010A. FIG. 11C likewise illustrates cross-section 11C in which display surface 1001 and an instance of upper EHD air mover 1010B are both accommodated within the depth of flat panel display device 1000. In the illustrated bottom-to-top air flow, instances of upper EHD air mover 1010B are accommodated in a volume behind display surface 1001 and, accordingly, electrostatically operative features thereof are more tightly packed than analogous features of lower EHD air mover 1010A. Nonetheless, design and operation of the respective air movers are largely analogous.

In the case of EHD air mover 1010A (see FIG. 11B), electrostatically operative surfaces may be formed (at least partially) over subassembly structure. As previously explained, an exoskeletal structure (e.g., a partial subassembly enclosure) may provide relative positional fixation of collector electrodes 1192 and emitter electrode 1191 with respect to each other. In such cases, dielectric surfaces 1193 (e.g., polyimide film or tape) may lap over a portion of the exoskeletal structure 1111 and conformably extend in an upstream direction where they are provided on, or as part of, a surface of an EMI shield 1109. Alternatively (though not specifically shown in FIG. 11B) planar collector electrodes 1192 may be formed as, or more directly on, opposing interior surfaces of enclosure 1109.

As with certain collector electrodes designs described herein for pad-type and laptop style devices, in some embodiments of flat panel display 1000, a conductive (e.g., metallic) tape or strip may be affixed to the interior surface of a generally non-conductive case or surface thereof and coupled to ground to define each of the collector electrodes 1192. In general, the conductive tape or strip may be cut to a shape and extent desired for collector electrode 1192. Alternatively, a non-conductive (e.g., dielectric) layer otherwise overlaying a grounded conductive (e.g., metallic) layer or region may be etched or otherwise selectively removed to expose a surface of the shape and extent desired for collector electrode 1192. In some cases, the grounded conductive layer or region may be, or may be formed integrally with, enclosure 1109.

For EHD air mover 1010B (see FIG. 11C), a first instance of collector electrode 1192 is formed in any of the manners just described, while the second instance of collector electrode 1192 is formed on or as part of an EMI shield 1108 that isolates EHD air mover 1010B from display surface 1001. Exoskeletal structure of an EHD subassembly (though provided in some embodiments) is omitted for simplicity of illustration. As before, a conductive (e.g., metallic) tape or strip may be affixed to an otherwise non-conductive exposed surface of EMI shield 1108 and coupled to ground to define the second collector electrode instance. Also as before, the conductive tape or strip may be cut to a shape and extent desired for collector electrode 1192. Alternatively, a non-conductive (e.g., dielectric) layer otherwise overlaying a grounded conductive (e.g., metallic) interior layer or region of EMI shield 1108 may be etched or otherwise selectively removed to expose a surface of the shape and extent desired for collector electrode 1192.

For both EHD air mover 1010A and EHD air mover 1010B, respective instances of collector electrodes 1192 and emitter electrode 1191 are coupled between terminals of a high voltage power supply (not specifically shown, but as generally explained relative to FIG. 4) to generate an electric field and (in corona discharge-type embodiment such as illustrated) the ions that motivate air flow in a generally upward downstream direction as illustrated. As in previously described pad-type and laptop-style designs, emitter electrode 1191 instances may, in some embodiments, be coupled to a positive high voltage terminal of a power supply (illustratively +3.5 KV, although specific voltages and, indeed, any supply voltage waveforms may be matters of design choice) while collector electrodes 1192 instances are coupled to a local ground. Operation of EHD air movers 1010A and 1010B is substantially as described with reference to FIG. 4.

As with the collector electrodes, opposing instances of dielectric surfaces 1193 are provided on, or as part of, an exposed surface of EMI shield 1108 or enclosure 1109. These dielectric surfaces are electrostatically operative and contribute to field shaping in the respective EHD fluid mover while also providing a barrier to ion migration upstream. In particular, during operation of EHD air movers 1010A and 1010B, respective dielectric surfaces 1193 accumulate charge (such as from positive ions generated at a corona discharge type instance of emitter electrode 1191). As a result, dielectric surfaces 1193 are electrostatically operative as a barrier to upstream ion migration and tend to electrostatically mask any otherwise attractive paths to ground, such as enclosure 1109 itself or (particularly in the case of EHD air mover 1010A) parts of display 1001 or other electronic components not specifically shown. In this way, respective dielectric surfaces 1193 shape the electric fields established by EHD air movers 1010A and 1010B in the primarily downstream direction (upward in FIGS. 11A and 11B) toward respective instances of collector electrodes 1192.

Additional ion migration barriers may be provided. For example, in the illustrations of FIGS. 11B and 11C, an additional ion repelling barrier 1195 is introduced as a dielectric mesh, grid, grate or other air permeable curtain across a substantial upstream cross-section of the EHD motivated flow. As before, barrier 1195 accumulates charge (again from positive ions generated at corona discharge type instances of emitter electrode 1191 or elsewhere) and operates as an electrostatic barrier to upstream ion migration. In the configuration illustrated, conductive paths 1194 to ground are provided to capture ions that may nonetheless migrate upstream past barrier 1195.

Although available interior volumes and tolerances are, in general, implementation and design dependent, it should be clear from the illustrations and description herein that a thin flat panel display device may afford 5 mm or less of its total depth d for EHD air mover 1010B or 1010A.

In the configurations depicted, a unidirectional air flow entering (1002) at the bottom of flat panel display 1001 and exiting (1003) at the top thereof is provided and EHD air movers instances are positioned to motivate air flow for respective positions upstream of heat transfer fins 1120 thermally coupled to elongate edge positioned arrays of illumination sources (LED illuminators 1150) that generate a substantial portion of heat to be exhausted from enclosure 1109. Although such flow and such positioning places EHD air mover 1010B in the more tightly constrained depth behind display 1001, it allows ozone reducing materials (e.g., ozone reducing catalyst or reactive material) to be placed downstream of both air movers on surfaces, such as the heat transfer fins 1120 themselves (or heat spreaders, LED illuminator assemblies, etc.) whose heated surfaces tend to increase efficacy of the ozone reduction.

Other Embodiments

While the techniques and implementations of the EHD devices discussed herein have been described with reference to exemplary embodiments, it will be understood by those skilled in the art that various changes may be made and equivalents may be substituted for elements thereof without departing from the scope of the appended claims. In addition, many modifications may be made to adapt a particular situation or material to the teachings without departing from the essential scope thereof. Therefore, the particular embodiments, implementations and techniques disclosed herein, some of which indicate the best mode contemplated for carrying out these embodiments, implementations and techniques, are not intended to limit the scope of the appended claims.

What is claimed is:

1. An electronic device comprising:
  an enclosure;
  at least one electronic assembly including one or more thermal sources disposed thereon; and
  an EHD fluid mover configured as part of a thermal management system for the electronic device, wherein at least one electrostatically operative portion of the EHD fluid mover is formed as, or on, an upstream extending, interior surface of the enclosure.

2. The electronic device of claim 1,
  having a thickness of less than about 10 mm, and
  having extent in one or more lateral dimensions that exceeds the thickness by at least a factor of 10::1.

3. The electronic device of claim 1,
  the EHD fluid mover including at least one emitter electrode and at least one collector electrode, wherein the at least one electrostatically operative portion includes the collector electrode.

4. The electronic device of claim 1,
  the EHD fluid mover including at least one emitter electrode and at least one collector electrode, wherein the at least one electrostatically operative portion includes a dielectric coated field shaping portion of the interior surface of the enclosure adjacent to the emitter electrode.

5. The electronic device of claim 4,
  wherein the dielectric is provided at least in part as a polyimide film or tape affixed, at least in part, on or over the interior surface.

6. The electronic device of claim 4,
  wherein the dielectric is resistant to degradation in an ozone containing fluid.

7. The electronic device of claim 4,
  wherein the dielectric coated field shaping portion of the interior surface extends about three (3) emitter electrode to collector electrode lengths upstream of the emitter electrode.

8. The electronic device of claim 1, further comprising:
  a second electrostatically operative portion of the EHD fluid mover overlaying at least a portion of the electronic assembly.

9. The electronic device of claim 8,
  wherein the overlaid portion of the electronic assembly defines at least a portion of a high voltage power supply coupled to energize the EHD fluid mover.

10. The electronic device of claim 1,
  wherein the electronic assembly includes one or more of a circuit board and a display device.

11. The electronic device of claim 1, wherein the thermal sources include one or more of:
  a processor;
  a radio frequency (RF) or optical transceiver; and
  illumination sources for a display device.

12. The electronic device of claim 1,
wherein the enclosure is substantially sealed such that fluid flow motivated by the EHD fluid mover is substantially contained within the enclosure.

13. The electronic device of claim 1,
wherein the enclosure allows at least some fluid flow to transit a boundary between an interior volume therewithin and the exterior.

14. The electronic device of claim 13,
wherein flux of fluid through the EHD fluid mover substantially exceeds, at least by a factor of two, that transiting the boundary.

15. The electronic device of claim 13,
wherein the enclosure includes one or more ventilation portions of the boundary through which a substantial entirety of the fluid flux motivated by the EHD fluid mover is admitted and exhausted.

16. The electronic device of claim 1,
wherein the thermal sources are closely proximate, within about 3 mm, of an interior surface of the enclosure,
the thermal management system operable to spread heat evolved at the thermal sources over a substantial portion of the interior surface.

17. The electronic device of claim 1, configured as one or more of:
a handheld mobile phone or personal digital assistant;
a laptop, netbook or pad-type computer; and
a digital book reader, media player or gaming device.

18. The electronic device of claim 1, configured as one or more of:
a display panel; and
a television.

19. An electronic device comprising:
at least one electronic assembly including one or more thermal sources disposed thereon;
an electromagnetic interference (EMI) shield of conductive material; and
an EHD fluid mover configured as part of a thermal management system for the electronic device, wherein at least one electrostatically operative portion of the EHD fluid mover is formed as, or on, an upstream extending surface of the EMI shield.

20. The electronic device of claim 19,
wherein the EMI shield at least partially overlays a portion of the electronic assembly.

21. The electronic device of claim 20,
wherein the overlaid portion the electronic assembly includes at least a portion of a high voltage power supply coupled to energize the EHD fluid mover.

22. The electronic device of claim 19,
wherein one or more conductive planes or traces of the electronic assembly provide the EMI shield.

23. The electronic device of claim 19,
having a thickness of less than about 10 mm, and
having extent in one or more lateral dimensions that exceeds the thickness by at least a factor of 10::1.

24. The electronic device of claim 19,
the EHD fluid mover including at least one emitter electrode and at least one collector electrode, wherein the at least one electrostatically operative portion includes the collector electrode.

25. The electronic device of claim 19,
the EHD fluid mover including at least one emitter electrode and at least one collector electrode, wherein the at least one electrostatically operative portion includes a dielectric coated field shaping portion of the surface of the EMI shield adjacent to the emitter electrode.

26. The electronic device of claim 25,
wherein the dielectric coating is resistant to degradation in an ozone containing fluid.

27. The electronic device of claim 19,
wherein the electronic assembly includes one or more of a circuit board and a display device.

28. The electronic device of claim 19, wherein the thermal sources include one or more of:
a processor;
a radio frequency (RF) or optical transceiver; and
illumination sources for a display device.

29. The electronic device of claim 19, further comprising:
an enclosure substantially sealed such that fluid flow motivated by the EHD fluid mover is substantially contained within the enclosure.

30. The electronic device of claim 19,
an enclosure that allows at least some fluid flow to transit a boundary between an interior volume therewithin and the exterior.

31. The electronic device of claim 30,
wherein flux of fluid through the EHD fluid mover substantially exceeds, at least by a factor of two, that transiting the boundary.

32. The electronic device of claim 30,
wherein the enclosure includes one or more ventilation portions of the boundary through which a substantial entirety of the fluid flux motivated by the EHD fluid mover is admitted and exhausted.

33. The electronic device of claim 19, further comprising:
an enclosure;
wherein the thermal sources are closely proximate, within about 3 mm, of an interior surface of the enclosure,
the thermal management system operable to spread heat evolved at the thermal sources over a substantial portion of the interior surface.

34. The electronic device of claim 19, further comprising:
an enclosure;
wherein at least one other electrostatically operative portion of the EHD fluid mover is formed as, or on, an upstream extending, interior surface of the enclosure.

35. The electronic device of claim 19,
wherein the EMI shield also defines at least a portion of a thermally conductive pathway from the thermal sources to heat transfer surfaces in a flow path along which fluid flow is motivated by the EHD fluid mover when energized.

36. An electronic device comprising:
a display, at least one circuit board, an electrohydrodynamic (EHD) fluid mover and an enclosure layered one atop another to define a total thickness of the electronic device at less than about 10 mm;
the EHD fluid mover configured as part of a thermal management system for the electronic device and including opposing planar dielectric surfaces, at least one emitter electrode and one or more collector electrodes, the emitter electrode positioned between the opposing planar dielectric surfaces and proximate to the collector electrode to, when energized, accelerate ions toward the collector electrode and thereby motivate fluid flow within the electronic device,
wherein a first one of the opposing dielectric surfaces is at least partially formed as or on a surface of an EMI shield over the circuit board.

37. The electronic device of claim 36,
wherein the collector electrodes number at least two, a first one of the collector electrodes formed as or on an exposed metallization layer of the circuit board.

38. The electronic device of claim 37,
a second one of the collector electrodes formed as or on an interior surface of the enclosure.

39. The electronic device of claim 36,
wherein the one or more collector electrodes are formed as or on an interior surface of the enclosure.

40. The electronic device of claim 36,
wherein at least a portion of the EMI shield is formed as or on a dielectric coated metallization layer of the circuit board.

41. The electronic device of claim 36, further comprising:
a thermal transfer pathway from one or more thermal sources disposed on the circuit board to heat transfer surfaces in a flow path along which fluid flow is motivated by the EHD fluid mover when energized.

42. The electronic device of claim 41,
at least a portion of the thermal transfer pathway provided by the EMI shield.

43. The electronic device of claim 36,
wherein the thermal sources are closely proximate, within about 3 mm, of an interior surface of the enclosure,
the thermal management system operable to spread heat evolved at the thermal sources over a substantial portion of the interior surface.

44. The electronic device of claim 36,
wherein the enclosure substantially seals the electronic device such that fluid flow motivated by the EHD fluid mover is substantially contained therewithin.

45. The electronic device of claim 36,
wherein the enclosure allows at least some fluid flow to transit a boundary between an interior volume therewithin and the exterior.

46. The electronic device of claim 45,
wherein flux of fluid through the EHD fluid mover substantially exceeds, at least by a factor of two, that transiting the boundary.

47. The electronic device of claim 45,
wherein the enclosure includes one or more ventilation portions of the boundary through which a substantial entirety of the fluid flux motivated by the EHD fluid mover is admitted and exhausted.

48. The electronic device of claim 36, configured as one or more of:
a handheld mobile phone or personal digital assistant;
a laptop, netbook or pad-type computer; and
a digital book reader, media player or gaming device.

49. The electronic device of claim 36, configured as one or more of:
a display panel; and
a television.

50. The electronic device of claim 36,
wherein at least a portion of either or both of the circuit board and an interior surface of the enclosure are coated with a protective coating robust to ozone.

51. The electronic device of claim 50,
wherein the protective coating robust to ozone includes a fluoropolymer of tetrafluoroethylene such as a Teflon® material.

52. The electronic device of claim 36,
wherein at least a portion of either or both of the circuit board and an interior surface of the enclosure are coated with an ozone catalytic or reactive material.

53. The electronic device of claim 1, further comprising:
heat transfer surfaces of the thermal management system interposed along a path of the motivated fluid flow between the EHD fluid mover and an exhaust ventilation boundary.

54. The electronic device of claim 19, further comprising:
heat transfer surfaces of the thermal management system interposed along a path of the motivated fluid flow between the EHD fluid mover and an exhaust ventilation boundary.

* * * * *